United States Patent
Ohkubo

(10) Patent No.: US 6,169,000 B1
(45) Date of Patent: Jan. 2, 2001

(54) PROCESS FOR THE PRODUCTION OF SEMICONDUCTOR SUBSTRATE HAVING SILICON-ON-INSULATING STRUCTURE AND PROCESS FOR THE PRODUCTION OF SEMICONDUCTOR DEVICE

(75) Inventor: Yasunori Ohkubo, Kanagawa (JP)

(73) Assignee: Sony Corporation, Tokyo (JP)

(*) Notice: Under 35 U.S.C. 154(b), the term of this patent shall be extended for 0 days.

(21) Appl. No.: 09/401,195

(22) Filed: Sep. 23, 1999

(30) Foreign Application Priority Data

Sep. 29, 1998 (JP) .................................................. 10-274569

(51) Int. Cl.$^7$ .................................................. H01L 21/336
(52) U.S. Cl. .......................... 438/289; 438/289; 438/270; 438/272
(58) Field of Search .................................... 438/289, 270, 438/272, 290, 291, 283; 257/77, 640, 649, 347, 386, 397

(56) References Cited

U.S. PATENT DOCUMENTS

| 5,185,292 | * | 2/1993 | VanVonno et al. | 437/180 |
| 5,258,318 | * | 11/1993 | Buti et al. | 437/34 |
| 5,310,451 | * | 5/1994 | Tejani et al. | 156/630 |
| 5,614,750 | * | 3/1997 | Ellul et al. | 257/77 |
| 5,674,784 | * | 10/1997 | Jang et al. | 437/195 |
| 5,899,719 | * | 5/1999 | Hong | 438/289 |

FOREIGN PATENT DOCUMENTS 7-226433  8/1995  (JP) .
8-279605  10/1996  (JP) .

OTHER PUBLICATIONS

Recent Newspaper Production Major Equipments—1986, issued by Japanese Newspaper Association.

* cited by examiner

Primary Examiner—Charles Bowers
Assistant Examiner—Laura Schillinger
(74) Attorney, Agent, or Firm—Ronald P. Kananen; Rader, Fishman & Grauer

(57) ABSTRACT

A process for the production of a semiconductor substrate having a silicon-on-insulator structure comprising the steps of; (A) ion-implanting a semiconductor substrate to form a buried polishing-stop layer inside the semiconductor substrate, (B) patterning a portion of the semiconductor substrate above the buried polishing-stop layer to form a trench portion which reaches the buried polishing-stop layer, thereby forming a semiconductor layer on the buried polishing-stop layer, (C) forming an insulating layer on the semiconductor layer and the buried polishing-stop layer, (D) bonding the semiconductor substrate and a supporting substrate to each other through the insulating layer, (E) grinding and polishing the semiconductor substrate from its rear surface to expose the buried polishing-stop layer, and (F) removing the buried polishing-stop layer to expose the semiconductor layer, in which the semiconductor layer has a thickness of $2\times10^{-8}$ m to $1\times10^{-7}$ m and the buried polishing-stop layer has a thickness of $2\times10^{-9}$ m to $1\times10^{-8}$ m.

20 Claims, 15 Drawing Sheets

[STEP-100]

[STEP-110]

[STEP-120]

[STEP-130]

[STEP-140]

[STEP-140] CONTINUED

[STEP-150]

[STEP-160]

[STEP-220]

[STEP-230]

[STEP-230] CONTINUED

[STEP-240]

[STEP-250]

[STEP-260]

[STEP-300]

[STEP-310]

[STEP-320]

[STEP-330]

[STEP-330] CONTINUED

[STEP-340]

[STEP-350]

[STEP-410]

[STEP-410] CONTINUED

[STEP-420]

[STEP-420] CONTINUED

[STEP-430]

[STEP-440]

[STEP-450]

[STEP-10]

[STEP-10] CONTINUED

[STEP-20]

[STEP-30]

[STEP-30] CONTINUED

PROCESS FOR THE PRODUCTION OF SEMICONDUCTOR SUBSTRATE HAVING SILICON-ON-INSULATING STRUCTURE AND PROCESS FOR THE PRODUCTION OF SEMICONDUCTOR DEVICE

BACKGROUND OF THE INVENTION AND RELATED ART STATEMENT

The present invention relates to a process for the production of a semiconductor substrate having a silicon-on-insulator structure and a process for the production of a semiconductor device for which the above process for production of a semiconductor substrate having a silicon-on-insulator structure is applied.

The SOI (Silicon-On-Insulator) method of forming a semiconductor device in a single crystal silicon layer formed on an insulating layer composed of, for example, $SiO_2$ is excellent in a-ray durability and a latch-up characteristic and is also suitable for suppressing short channel effect. It is an essential problem how to form a thin single crystal silicon layer (called SOI layer) on the insulating layer.

For forming an SOI layer, for example, a SIMOX (Separation by IMplanted OXygen) method is known. In the SIMOX method, a silicon semiconductor substrate is ion-implanted with a high dosage (for example, $1.8 \times 10^{18}$ cm$^{-2}$ to $2.0 \times 10^{18}$ cm$^{-2}$) of an oxygen ion at high acceleration energy (for example, 180 to 200 keV) and then annealed at a high temperature to form a buried insulating layer composed of $SiO_2$ inside the silicon semiconductor substrate. A portion above the buried insulating layer is left as a silicon semiconductor layer (SOI) layer, and a semiconductor device is formed in the SOI layer.

As other method for forming an SOI layer, there is known a so-called substrate-bonding method. The substrate-bonding method will be outlined with reference to FIGS. 15A, 15B, 16A, 16B and 17 hereinafter.

First, a trench portion 12 is formed in a semiconductor substrate 10 by lithography and etching processes (see FIG. 15A). Then, an approximately 0.6 μm thick insulating layer 20 composed of $SiO_2$ is formed on the entire surface by a known CVD method, to fill up the trench portion 12 with the insulating layer 20. Further, an approximately 5 μm thick polycrystalline silicon (polysilicon) layer 21 is formed on the entire surface by a known CVD method, and the surface of the polycrystalline silicon layer 21 is planarized. This state is shown in FIG. 15B.

Thereafter, the silicon semiconductor substrate 10 and a supporting substrate 30 are bonded to each other through the insulating layer 20 and further through the polycrystalline silicon layer 21 (see FIG. 16A). The above bonding is carried out, for example, under a condition of an oxygen gas atmosphere at 1100° C. for 30 minutes.

Then, the silicon semiconductor substrate 10 is ground and polished from its rear surface. Specifically, first, the silicon semiconductor substrate 10 is mechanically ground with diamond grinding grains from its rear surface until the silicon semiconductor substrate 10 comes to be several μm thick from the bottom portion 12A of the trench portion 12 so that no grinding damage is caused to remain in the SOI layer (see FIG. 16B). Then, the silicon semiconductor substrate 10 is selectively polished by a chemical/mechanical polishing method (CMP method) until the bottom 12A of the trench portion 12 is exposed. The insulating layer 20 filled in the trench portion 12 works as a polishing-stop layer, and a semiconductor layer 10A which is a remaining portion of the silicon semiconductor substrate 10 is left as an SOI layer (see FIG. 17). The trench portion 12 formed in the silicon semiconductor substrate 10 is in a state where it is filled with the insulating layer 20, and it works for a device isolation region.

In the SIMOX method, since a silicon semiconductor substrate is ion-implanted with a high dosage of an ion at high acceleration energy, the crystal defect density in the silicon semiconductor substrate is approximately 100 times as large as the crystal defect density in a single crystal silicon semiconductor substrate produced by a general Czochralski method. When a semiconductor device is formed in the semiconductor layer 10A having such a high crystal defect density, the problem is that all the semiconductor devices that can be obtained show poor performances. Further, there is caused a "pipe" phenomenon, an inherent phenomenon of the SIMOX method, that particles adhering the surface of the silicon semiconductor substrate prevent the ion-implantation, and a current path to the silicon semiconductor substrate is formed. As a result, the semiconductor device is liable to cause a failure in performances and a decrease in reliability.

When the semiconductor layer 10A which is a remaining portion of the semiconductor substrate is formed by polishing the semiconductor substrate from its rear surface in the substrate-bonding method, not only it is difficult to control the thickness of the semiconductor layer 10A, but also a variation in the thickness of the semiconductor layer 10A is liable to take place. Further, an in-plane variation in one silicon semiconductor substrate is also liable to take place. Particular, when the semiconductor layer 10A surrounded by the trench portions 12 formed in the silicon semiconductor substrate 10 has a large area, a so-called dishing phenomenon is liable to take place in which the surface of the semiconductor layer 10A is polished to form a concave shape (see FIG. 18).

The present Applicant proposed methods for overcoming the above problems of the SIMOX method or substrate-bonding methods by filing Japanese patent applications which have been laid-open as JP-A-7-226433 and JP-A-8-279605. In the methods disclosed in the above Japanese Laid-open Patent Publications, an SOI layer is formed by a combination of the SIMOX method and the substrate-bonding method. That is, a buried polishing-stop layer is formed inside a silicon semiconductor substrate by the SIMOX method, an insulating layer is formed on the silicon semiconductor substrate, then, the silicon semiconductor substrate and a supporting substrate are bonded to each other through the insulating layer, and then, the silicon semiconductor substrate is ground and polished from its rear surface until the buried polishing-stop layer is reached. In the methods disclosed in JP-A-7-226433 and JP-A-8-279605, the silicon semiconductor substrate is polished from its rear surface until the buried polishing-stop layer is reached, then, the buried polishing-stop layer is removed, and then, SOI layer is further polished to form a thin SOI layer.

In recent years, one method is attracting attention, in which the SOI layer is thickness-decreased to 100 nm or less and source/drain regions of a MOS type transistor are formed along the entire thickness of the SOI layer. Since the capacitance of the source/drain regions decreases, particularly, the transistor can be operated at a high speed at a low voltage of a power source, and the above method is expected to materialize a low power consumption.

As explained above, for producing a semiconductor device which permits high-speed operation at a low voltage of a power source and has high reliability, it is essential to form an SOI layer which has a low crystal defect density and has a small thickness.

In the methods disclosed in the above Japanese Laid-open Patent Publications, the thickness of a formed SOI layer is as large as 100 nm to 200 nm, the dosage of an ion implanted for forming a buried polishing-stop layer by the SIMOX method is as high as $1\times10^{17}$ cm$^{-2}$ to $1\times10^{18}$ cm$^{-2}$, and the formed buried insulating layer comes to have a thickness of approximately 0.1 $\mu$m to 0.4 $\mu$m. Due to the above high dosage of the ion-implantation, the silicon semiconductor substrate where the SOI layer is to be formed has a high crystal defect density. It is therefore essentially required to decrease the crystal defects by polishing the silicon semiconductor substrate from its rear surface until the buried polishing-stop layer is reached, removing the buried polishing-stop layer and then further polishing the SOI layer to decrease the SOI layer in thickness. However, the step of further polishing the SOI layer to decrease its thickness is not only complicated but also causes a variation in thickness of the SOI layer. Further, the ion-implantation at a high dosage leaves crystal defects in the remaining SOI layer.

OBJECT AND SUMMARY OF THE INVENTION

It is therefore an object of the present invention to provide a process for the production of a semiconductor substrate having an SOI layer which has a low crystal defect density and has a small thickness and which has a decreased variation in thickness, and a process for the production of a semiconductor device, for which the process for the production of a semiconductor substrate having the above silicon-on-insulator structure is applied.

The process for the production of a semiconductor substrate having a silicon-on-insulator structure according to a first aspect of the present invention for achieving the above object comprises the steps of;

(A) ion-implanting a semiconductor substrate to form a buried polishing-stop layer inside the semiconductor substrate, (B) patterning a portion of the semiconductor substrate above the buried polishing-stop layer to form a trench portion which reaches the buried polishing-stop layer, thereby forming a semiconductor layer on the buried polishing-stop layer, (C) forming an insulating layer on the semiconductor layer and the buried polishing-stop layer, (D) bonding the semiconductor substrate and a supporting substrate to each other through the insulating layer, (E) grinding and polishing the semiconductor substrate from its rear surface to expose the buried polishing-stop layer, and (F) removing the buried polishing-stop layer to expose the semiconductor layer, in which the semiconductor layer has a thickness of $2\times10^{-8}$ m to $1\times10^{-7}$ m and the buried polishing-stop layer has a thickness of $2\times10^{-9}$ m to $1\times10^{-8}$ m.

The process for the production of a semiconductor substrate having a silicon-on-insulator structure according to a second aspect of the present invention for achieving the above object comprises the steps of;

(A) ion-implanting a semiconductor substrate to form a buried polishing-stop layer inside the semiconductor substrate, (B) forming an insulating layer on the semiconductor substrate, (C) bonding the semiconductor substrate and a supporting substrate to each other through the insulating layer, (D) grinding and polishing the semiconductor substrate from its rear surface to expose the buried polishing-stop layer, and (E) removing the buried polishing-stop layer to expose a remaining portion of the semiconductor substrate, in which the remaining portion of the semiconductor substrate has a thickness of $2\times10^{-8}$ m to $1\times10^{-7}$ m and the buried polishing-stop layer has a thickness of $2\times10^{-9}$ m to $1\times10^{-8}$ m.

The process for the production of a semiconductor device according to a first aspect of the present invention for achieving the above object comprises the steps of;

(A) ion-implanting a semiconductor substrate to form a buried polishing-stop layer inside the semiconductor substrate, (B) patterning a portion of the semiconductor substrate above the buried polishing-stop layer to form a trench portion which reaches the buried polishing-stop layer, thereby forming a semiconductor layer on the buried polishing-stop layer, (C) forming an insulating layer on the semiconductor layer and the buried polishing-stop layer, (D) bonding the semiconductor substrate and a supporting substrate to each other through the insulating layer, (E) grinding and polishing the semiconductor substrate from its rear surface to expose the buried polishing-stop layer, (F) removing the buried polishing-stop layer to expose the semiconductor layer, and (G) forming a semiconductor device in the semiconductor layer, in which the semiconductor layer has a thickness of $2\times10^{-8}$ m to $1\times10^{-7}$ m and the buried polishing-stop layer has a thickness of $2\times10^{-9}$ m to $1\times10^{-8}$ m.

The process for the production of a semiconductor device according to a second aspect of the present invention for achieving the above object comprises the steps of;

(A) ion-implanting a semiconductor substrate to form a buried polishing-stop layer inside the semiconductor substrate, (B) forming an insulating layer on the semiconductor substrate, (C) bonding the semiconductor substrate and a supporting substrate to each other through the insulating layer, (D) grinding and polishing the semiconductor substrate from its rear surface to expose the buried polishing-stop layer, (E) removing the buried polishing-stop layer to expose a remaining portion of the semiconductor substrate, and (F) forming a semiconductor device in the remaining portion of the semiconductor substrate, in which the remaining portion of the semiconductor substrate has a thickness of $2\times10^{-8}$ m to $1\times10^{-7}$ m and the buried polishing-stop layer has a thickness of $2\times10^{-9}$ m to $1\times10^-$m.

The process for the production of a semiconductor device according to a third aspect of the present invention for achieving the above object comprises the steps of;

(A) ion-implanting a semiconductor substrate to form a buried polishing-stop layer inside the semiconductor substrate, (B) patterning a portion of the semiconductor substrate above the buried polishing-stop layer to form a trench portion which reaches the buried polishing-stop layer, thereby forming a semiconductor layer on the buried polishing-stop layer, (C) forming an insulating film on the surface of the semiconductor layer, (D) forming part of constituents of a semiconductor device on the insulating film, (E) forming an interlayer on the entire surface and then bonding the semiconductor substrate and a supporting substrate through the interlayer, (F) grinding and polishing the semiconductor substrate from its rear surface to expose the buried polishing-stop layer, (G) removing the buried polishing-stop layer to expose the semiconductor layer, and (H) forming the rest of the constituents of the semiconductor device in the semiconductor layer, in which the semiconductor layer has a thickness of $2 \times 10^{-8}$ m to $1 \times 10^{-7}$ m and the buried polishing-stop layer has a thickness of $2 \times 10^{-9}$ m to $1 \times 10^{-8}$ m.

The process for the production of a semiconductor device according to a fourth aspect of the present invention for achieving the above object comprises the steps of;

(A) ion-implanting a semiconductor substrate to form a buried polishing-stop layer inside the semiconductor substrate, (B) forming an insulating film on the surface of the semiconductor substrate, (C) forming part of constituents of a semiconductor device on the insulating film, (D) forming an interlayer on the entire surface and then bonding the semiconductor substrate and a supporting substrate through the interlayer, (E) grinding and polishing the semiconductor substrate from its rear surface to expose the buried polishing-stop layer, (F) removing the buried polishing-stop layer to expose a remaining portion of the semiconductor substrate, and (G) forming the rest of the constituents of the semiconductor device in the remaining portion of the semiconductor substrate, in which the remaining portion of the semiconductor substrate has a thickness of $2 \times 10^{-8}$ m to $1 \times 10^{-7}$ m and the buried polishing-stop layer has a thickness of $2 \times 10^{-9}$ m to $1 \times 10^{-8}$ m.

In the process for the production of a semiconductor substrate having a silicon-on-insulator structure according to the first or second aspect of the present invention, or in the process for the production of a semiconductor device according to any one of the first to fourth aspects of the present invention (to be sometimes generically simply referred to as the present invention), the buried polishing-stop layer preferably has a thickness of $5 \times 10^{-9}$ m to $1 \times 10^{-8}$ m.

In the present invention, the semiconductor substrate is ion-implanted for forming the buried polishing-stop layer inside the semiconductor substrate, and in this case, preferably, the acceleration energy of the ion is set at 10 keV to 100 keV, and the dosage of the ion is set at $1 \times 10^{16}$ cm$^{-2}$ to $1 \times 10^{17}$ cm$^{-2}$. The ion-implantation may be carried out once, or it may be carried out a plurality of times.

In the present invention, the ion used for the ion-implantation shall not be limited to an oxygen ion, and an ozone ion, a nitrogen ion or a germanium ion may be used.

The step (C) in the process for the production of a semiconductor substrate having a silicon-on-insulator structure according to the first aspect of the present invention, the step (B) in the process for the production of a semiconductor substrate according to the second aspect of the present invention, the step (C) for the production of a semiconductor device according to the first aspect of the present invention, or the step (B) in the process for the production of a semiconductor device according to the second aspect of the present invention is preferably a step of forming an SiO$_2$ layer on the entire surface by a chemical vapor deposition method (CVD method). In some case, there may be employed an embodiment in which the insulating layer is formed, then, a polycrystalline silicon layer is deposited on the insulating layer by a CVD method and the semiconductor substrate and a supporting substrate are bonded to each other through the insulating layer and the polycrystalline silicon layer.

In the step (C) of the process for the production of a semiconductor device according to the third aspect of the present invention, or in the step (B) of the process for the production of a semiconductor device according to the fourth aspect of the present invention, preferably, the insulating film is formed on the surface of the semiconductor layer or semiconductor substrate by a thermal oxidation method or a combination of a thermal oxidation method and a thermal nitriding method. In the step (E) of the process for the production of a semiconductor device according to the third aspect of the present invention, or in the step (D) of the process for the production of a semiconductor device according to the fourth aspect of the present invention, the interlayer includes an SiO$_2$ film formed by a CVD method, or a two-layered structure composed of an SiO$_2$ film and a polycrystalline silicon film by CVD methods. In the process for the production of a semiconductor device according to the third or fourth aspect of the present invention, further, the part of constituents of the semiconductor device includes a gate electrode for forming a bottom gate structure, a gate electrode for forming a double gate structure (X-MOS type transistor structure in which a channel forming region is sandwiched between gate electrodes positioned above and below the channel forming region), a buried capacitor and a wiring. The rest of the constituents of the semiconductor device includes source/drain regions and a gate electrode. Further, the concept of "forming part of constituents of a semiconductor device on the insulating film" includes a concept of forming a semiconductor device on the insulating film including the semiconductor layer, and in this case, the rest of constituents of the semiconductor device includes another semiconductor device. That is, in this case, two semiconductor devices opposite to each other are formed, for example, in the semiconductor layer having two main surfaces thereof.

In the present invention, preferably, after the buried polishing-stop layer is formed inside the semiconductor substrate, heat treatment is carried out for recovery from crystal defects caused in the semiconductor substrate by the ion-implantation.

In the present invention, the semiconductor substrate includes a silicon semiconductor substrate. The method of grinding the semiconductor substrate includes a method of mechanical grinding with diamond grinding grains. The material for the insulating layer includes SiO$_2$ and others such as SiN and SiON. Further, the method of polishing the semiconductor substrate includes a chemical/mechanical polishing method using, for example, ethylenediamine hydrate [H$_2$N(CH$_2$)NH$_2$·H$_2$O]. Further, the method of removing the buried polishing-stop layer includes a wet etching method using a hydrofluoric acid aqueous solution, a wet etching method using a hot phosphoric acid aqueous solution and a wet etching method using a hydrogen peroxide aqueous solution.

In a conventional SIMOX method, it is required to impart a buried insulating layer with electric insulation properties, and it is therefore required to form a buried insulating layer which is uniform and free of "pipe" etc. In the present invention, unlike the conventional SIMOX method, it is sufficient to form the buried polishing-stop layer which works as a stop layer during polishing, and the buried polishing-stop layer is finally removed. In some cases, therefore, the buried polishing-stop layer in the form of islands may be formed inside the semiconductor substrate.

In the present invention, the buried polishing-stop layer is formed inside the semiconductor substrate by ion-implanting the semiconductor substrate, so that the depth of the buried polishing-stop layer from the surface of the semiconductor substrate can be controlled with a high accuracy, and the semiconductor layer or the remaining portion of the semiconductor substrate having a high thickness accuracy can be formed. Further, the buried polishing-stop layer having a remarkably small thickness as small as $2 \times 10^{-9}$ m to $1 \times 10^{-8}$ m is formed, so that the occurrence of a high density of crystal defects in the semiconductor substrate can be prevented when the buried polishing-stop layer is formed by the ion-implantation, and the semiconductor layer or the remaining portion of the semiconductor substrate can be maintained to keep its high quality. Further, the semiconductor substrate has a thickness of $2 \times 10^{-8}$ m to $1 \times 10^{-7}$ m, so that the source/drain regions of a MOS type transistor can be formed entirely along the thickness direction of the SOI layer.

BRIEF DESCRIPTION OF THE DRAWINGS

The present invention will be explained in detail with reference to drawings hereinafter.

FIG. 1C, are schematic partial cross-sectional views of the silicon semiconductor substrate, etc., for explaining the steps in Example 1.

FIG. 2B, are schematic partial cross-sectional views of the silicon semiconductor substrate, etc., for explaining the steps in Example 1.

FIG. 3B, is a schematic partial cross-sectional view of the silicon semiconductor substrate, etc., for explaining the steps in Example 1.

FIG. 5B, are schematic partial cross-sectional views of the silicon semiconductor substrate, etc., for explaining the steps in Example 2.

FIG. 6B, are schematic partial cross-sectional views of the silicon semiconductor substrate, etc., for explaining the steps in Example 2.

FIG. 8B, are schematic partial cross-sectional views of the silicon semiconductor substrate, etc., for explaining the steps in Example 3.

FIG. 9B, are schematic partial cross-sectional views of the silicon semiconductor substrate, etc., for explaining the steps in Example 3.

FIG. 10B, is a schematic partial cross-sectional view of the silicon semiconductor substrate, etc., for explaining the steps in Example 3.

FIG. 12C, are schematic partial cross-sectional views of the silicon semiconductor substrate, etc., for explaining the steps in Example 4.

FIG. 13B, are schematic partial cross-sectional views of the silicon semiconductor substrate, etc., for explaining the steps in Example 4.

FIG. 15B, are schematic partial cross-sectional views of the semiconductor substrate, etc., for explaining the steps of the conventional substrate-bonding method.

FIG. 16B, is schematic partial cross-sectional views of the semiconductor substrate, etc., for explaining the steps of the conventional substrate-bonding method.

DESCRIPTION OF THE PREFERRED EMBODIMENTS

EXAMPLE 1

Example 1 is concerned with a process for the production of a semiconductor substrate having a silicon-on-insulator structure according to the first aspect of the present invention, and with a process for the production of a semiconductor device according to the first aspect of the present invention. In Example 1, a silicon semiconductor substrate is ion-implanted with an oxygen ion to form a buried polishing-stop layer of $SiO_2$. In the semiconductor layer, a semiconductor device of a MOS type transistor is formed. Example 1 will be explained with reference to FIGS. 1A, 1B, 1C, 2A, 2B, 3A, 3B and 4 which are schematic partial cross-sectional views of a silicon semiconductor substrate and the like.

First, a silicon semiconductor substrate 10 is ion-implanted with an oxygen ion. Table 1 shows an example of a condition of the ion-implantation.

TABLE 1

| | |
|---|---|
| Ion species | oxygen ion |
| Acceleration energy | 20 keV |
| Dosage | $1 \times 10^{17}$ cm$^{-2}$ |
| Semiconductor substrate temperature | 500–600° C. |

After the ion-implantation, the silicon semiconductor substrate 10 is heat-treated, for example, in an $Ar/O_2$ atmosphere having a temperature around 1300° C. for Approximately 6 hours to recover the silicon semiconductor substrate 10 from crystal defects caused by the ion-implantation. In this manner, a buried polishing-stop layer 11 of $SiO_2$ can be formed inside the silicon semiconductor substrate 10 such that the buried polishing-stop layer 11 has its upper surface positioned 43 nm deep on average from the surface of the silicon semiconductor substrate 10 and has a thickness of approximately 100 nm (see FIG. 1A).

Figure 1A:
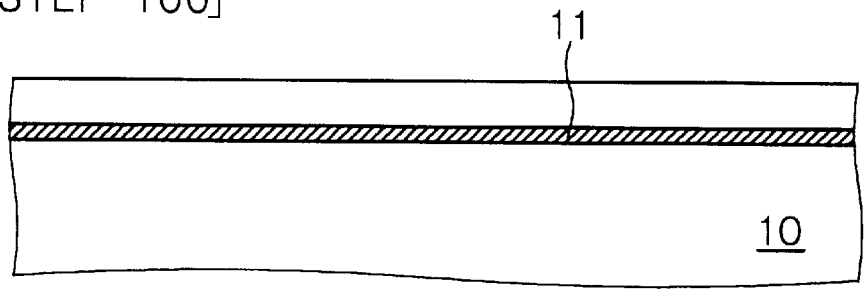
FIGS. 1A, 1B and 1C are schematic partial cross-sectional views of a silicon semiconductor substrate, etc., for explaining the steps in Example 1.
Figure 1B:
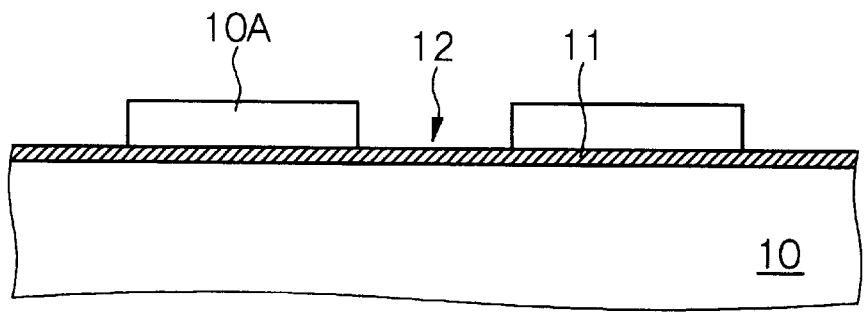
Figure 1C:
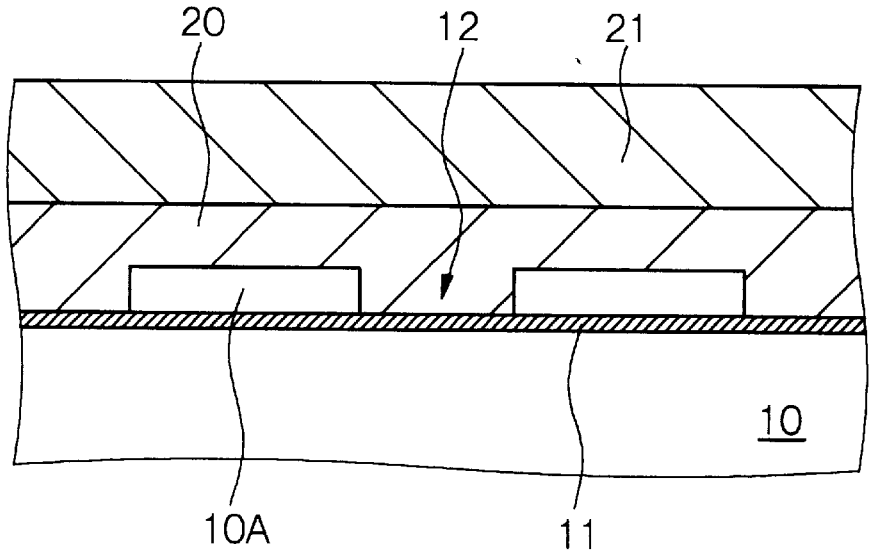
Figure 2A:
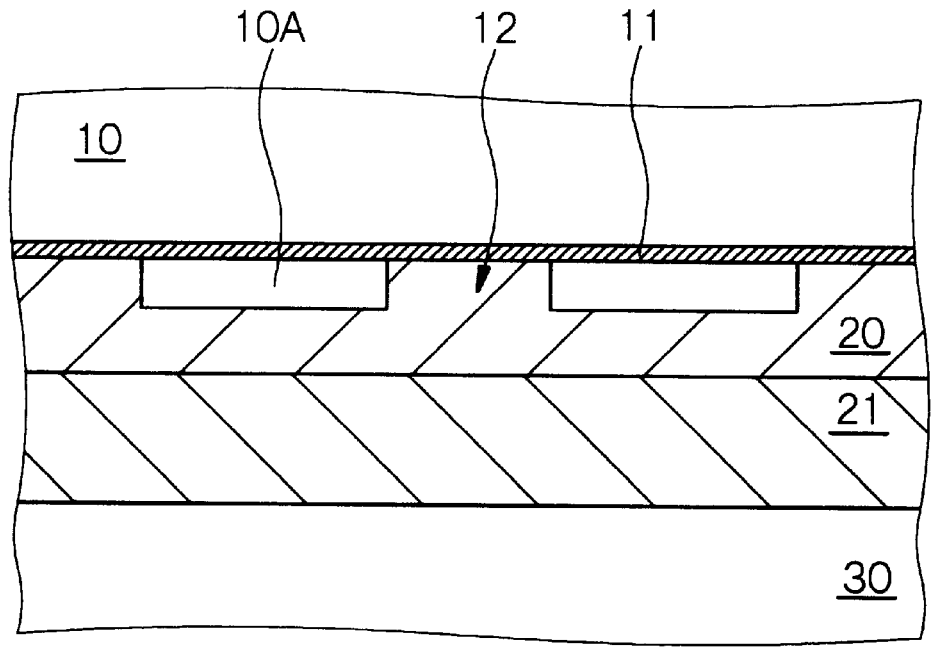
FIGS. 2A and 2B, following
Figure 2B:
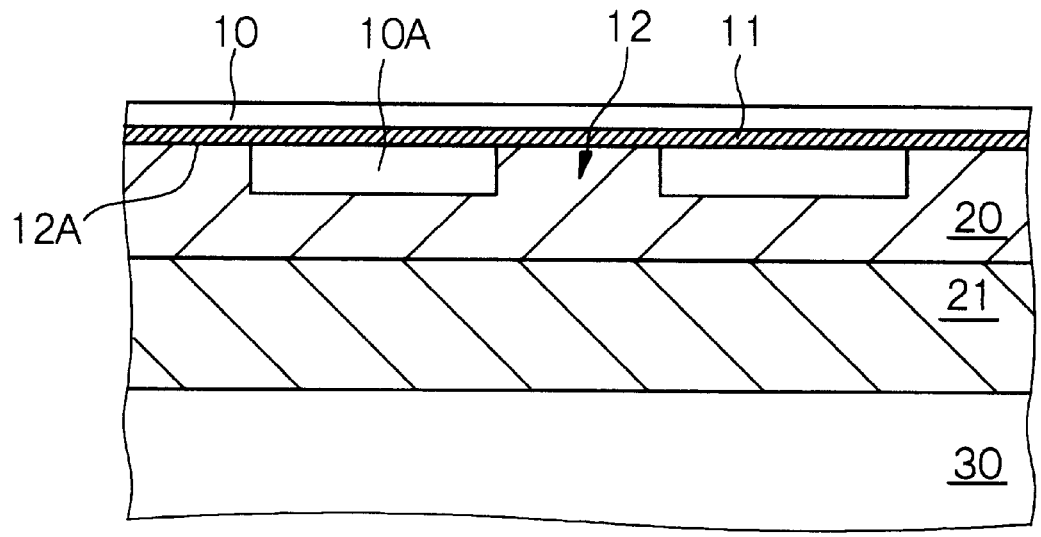

Then, a portion of the semiconductor substrate 10 above the buried polishing-stop layer 11 is patterned by a known lithography method and a known dry etching method, to form a trench portion 12 which reaches the buried polishing-stop layer 11, whereby a semiconductor layer 10A can be formed on the buried polishing-stop layer 11 (see FIG. 1B).

Then, an approximately 0.6 μm thick insulating layer 20 of $SiO_2$ is formed on the semiconductor layer 10A and the buried polishing-stop layer 11 by a CVD method. Then, a polycrystalline silicon layer 21, which is not any essential requirement, is formed on the insulating layer 20 by a CVD method and then the surface of the polycrystalline silicon layer 21 is planarized (see FIG. 1C).

Then, a supporting substrate 30 composed of a silicon semiconductor substrate and the silicon semiconductor substrate 10 are bonded to each other through the insulating layer 20 and the polycrystalline silicon layer 21. The bonding can be carried out, for example, under a condition of an oxygen gas atmosphere at 1100° C. for 30 minutes. In this manner, a structure shown in FIG. 2A can be obtained.

Then, the silicon semiconductor substrate 10 is ground and polished from its rear surface to expose the buried polishing-stop layer 11. Specifically, the silicon semiconductor substrate 10 is mechanically ground first with diamond grinding grains from its rear surface until the silicon semiconductor substrate 10 is left as one having a thickness of several μm above a bottom portion 12A of the trench portion 12 so that no grinding damage is caused to remain in the semiconductor layer 10A (see FIG. 2B). Then, the silicon semiconductor substrate 10 is selectively polished by a chemical/mechanical polishing method (CMP method) using an ethylenediamine hydrate until the buried polishing-stop layer 11 is exposed (see FIG. 3A). The buried polishing-stop layer 11 works as a polishing-stop layer, and the polishing does not proceed any further. Even when the buried polishing-stop layer 11 is formed in the form of islands, the buried polishing-stop layer 11 similarly works as a polishing-stop layer when it is exposed, and the polishing does not proceed any further.

Figure 3A:
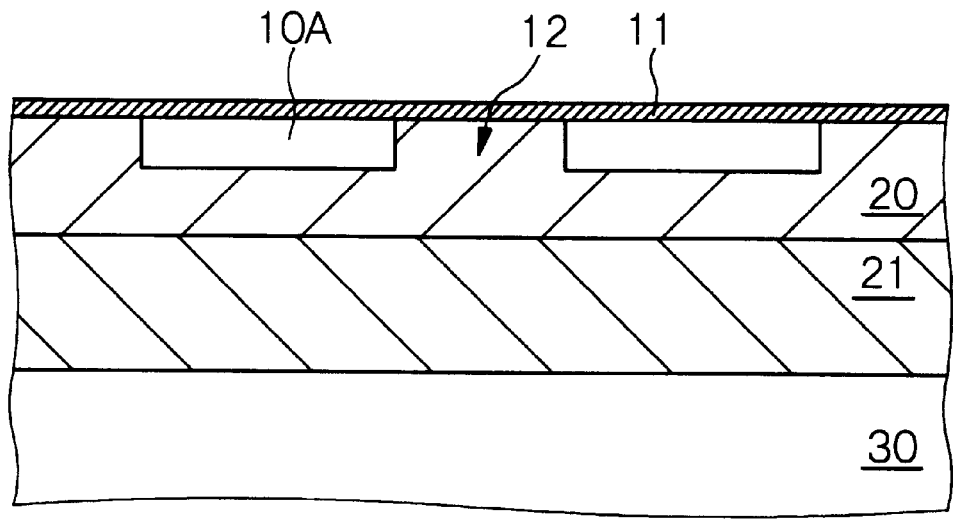
FIGS. 3A and 3B, following
Figure 3B:
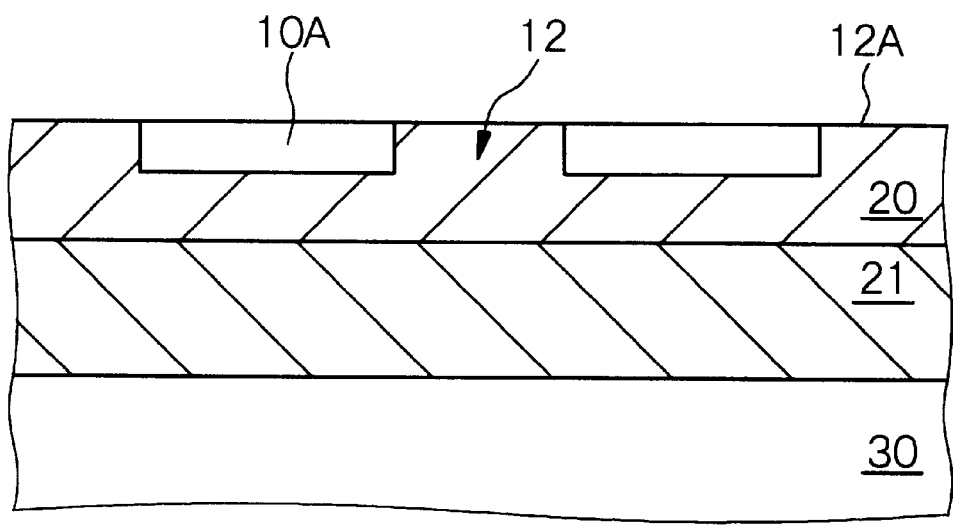
Figure 4:
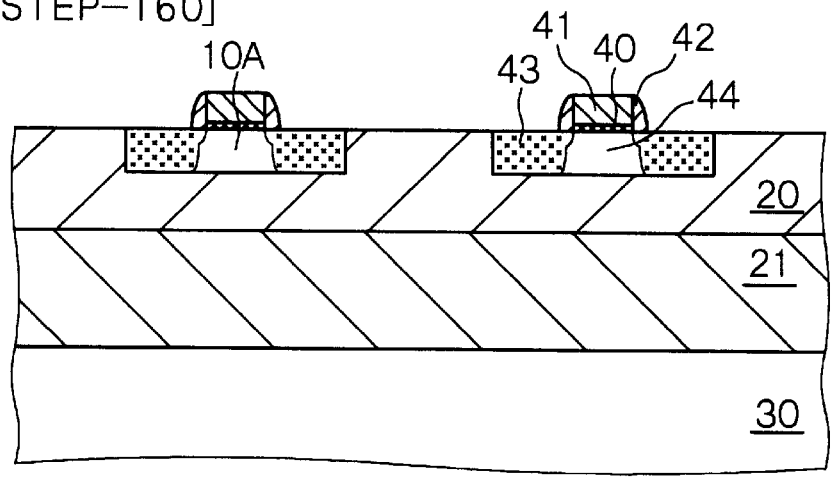
FIG. 4, following
Figure 5A:
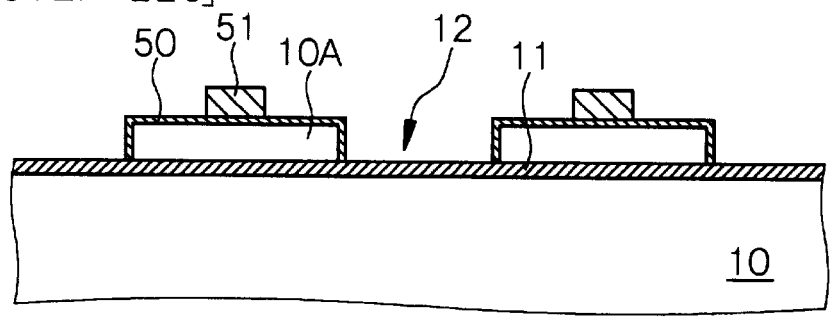
FIGS. 5A and 5B are schematic partial cross-sectional views of a silicon semiconductor substrate, etc., for explaining the steps in Example 2.
Figure 5B:
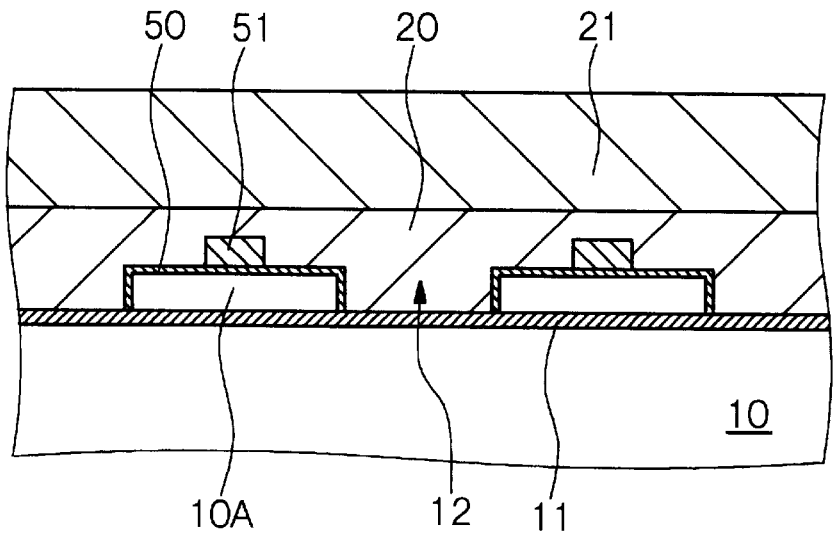

The buried polishing-stop layer 11 composed of $SiO_2$ is removed by a wet etching method using a hydrofluoric acid aqueous solution, to expose the semiconductor layer 10A and the bottom 12A of the trench portion 12 (see FIG. 3B). In this step, the insulating layer 20 in the trench portion 12 may be etched to some extent, which causes no practical problem. In this manner, the semiconductor layer 10A (thickness 43 nm) surround by the insulating layer 20 is left as an SOI layer. The trench portion 12 formed in the silicon semiconductor substrate 10 is in a state where the insulating layer 20 is filled therein, and it works for a device isolation region. According to the above steps, a semiconductor substrate having a silicon-on-insulator structure can be produced.

Then, a semiconductor device of a MOS type transistor is formed in the semiconductor layer 10A by a conventional method. That is, the surface of the semiconductor layer 10A is thermally oxidized to form a gate insulating film 40, and then, a gate electrode 41 having, for example, a polyside structure is formed. Then, for forming an LDD structure, the semiconductor layer 10A is ion-implanted for forming a low-concentration impurity region, and then, a gate sidewall 42 is formed on the side wall of a gate electrode 41. Then, the semiconductor layer 10A is ion-implanted to form a high-concentration impurity region entirely along the thickness direction of the semiconductor layer 10A, and the impurity provided by the ion-implantation is annealed to form source/drain regions 43 and a channel forming region 44 in the semiconductor layer 10A (see FIG. 4). Then, an insulating interlayer is formed on the entire surface, opening portions are formed in the insulating interlayer above the source/drain regions 43 as required, a wiring material layer is formed on the insulating interlayer including the insides of the opening portions, and the wiring material layer is patterned to form a wiring. In this manner, the semiconductor device in Example 1 is formed in the semiconductor layer 10A.

For forming the buried polishing-stop layer, an ozone ion may be used in place of the oxygen ion. Otherwise, a nitrogen ion or a germanium ion may be used. Tables 2 and 3 show ion-implantation conditions when a nitrogen ion and a germanium ion are used. Tables 2 and 3 further show compositions of the buried polishing-stop layers after heat treatment is carried out for recovery from crystal defects. The buried polishing-stop layer composed of SiN can be removed, for example, by a wet etching method using a hot phosphoric acid solution, and the buried polishing-stop layer composed of Si—Ge can be removed, for example, by a wet etching method using a hydrogen peroxide aqueous solution. The average depth of the buried polishing-stop layer from the surface of the silicon semiconductor substrate means that the buried polishing-stop layer is formed downwardly from a position indicated by the above average depth.

TABLE 2

| | |
|---|---|
| Ion species | nitrogen ion |
| Acceleration energy | 20 keV |
| Dosage | $1 \times 10^{17}$ cm$^{-2}$ |
| Semiconductor substrate temperature | 500–600° C. |
| Average depth of buried polishing-stop layer from silicon semiconductor substrate surface | 43 nm |
| Composition of buried polishing-stop layer | SiN |

TABLE 3

| | |
|---|---|
| Ion species | germanium ion |
| Acceleration energy | 50 keV |
| Dosage | $1 \times 10^{17}$ cm$^{-2}$ |
| Semiconductor substrate temperature | 500–600° C. |
| Average depth of buried polishing-stop layer from silicon semiconductor substrate surface | 33 nm |
| Composition of buried polishing-stop layer | Si—Ge |

EXAMPLE 2

Example 2 is concerned with a process for the production of a semiconductor device according to the third aspect of the present invention. In Example 2, a buried polishing-stop layer of $SiO_2$ is formed by ion-implanting a silicon semiconductor substrate with an oxygen ion as well. In Example 2, part of constituents of a semiconductor device is a gate electrode for forming a bottom gate structure, and the rest of the constituents of the semiconductor device is source/drain regions for a MOST type transistor having a bottom gate structure. Example 2 will be explained with reference to FIGS. 5A, 5B, 6A, 6B, 7A and 7B which are schematic partial cross-sectional views of the silicon semiconductor substrate and the like.

First, a silicon semiconductor substrate 10 is ion-implanted with an oxygen ion and heat-treated in the same manner as in Step-100 in Example 1, whereby a buried polishing-stop layer 11 of $SiO_2$ can be formed inside the silicon semiconductor substrate 10 such that the buried polishing-stop layer 11 has its upper surface positioned 43 nm deep on average from the surface of the silicon semiconductor substrate 10 and has a thickness of approximately 100 nm downwardly.

Then, a portion of the semiconductor substrate 10 above the buried polishing-stop layer 11 is patterned by a known lithography method and a known dry etching method, to form a trench portion 12 which reaches the buried polishing-stop layer 11. In this manner, a semiconductor layer 10A can be formed on the buried polishing-stop layer 11.

Then, an insulating film 50 is formed on the surface of the semiconductor layer 10A by a thermal oxidation method. Then, a gate electrode 51 which is part of constituents of a semiconductor device is formed on the insulting film 50 (see FIG. 5A). Specifically, for example, a polycrystalline silicon layer containing an impurity is deposited on the entire surface, and the polycrystalline silicon layer is patterned, whereby the gate electrode 51 can be formed.

Then, an interlayer is formed on the entire surface, and the semiconductor substrate and a supporting substrate are bonded to each other through the interlayer. Specifically, an insulating layer 20 composed of an $SiO_2$ and a polycrystalline silicon layer 21 are consecutively deposited on the entire surface by known CVD methods, and the polycrystalline silicon layer 21 is planarized (see FIG. 5B). Then, a supporting substrate 30 composed of a silicon semiconductor substrate and the silicon semiconductor substrate 10 are bonded to each other through the insulating layer 20 and the polycrystalline silicon layer 21 in the same manner as in Step-130 in Example 1 (see FIG. 6A).

Figure 6A:
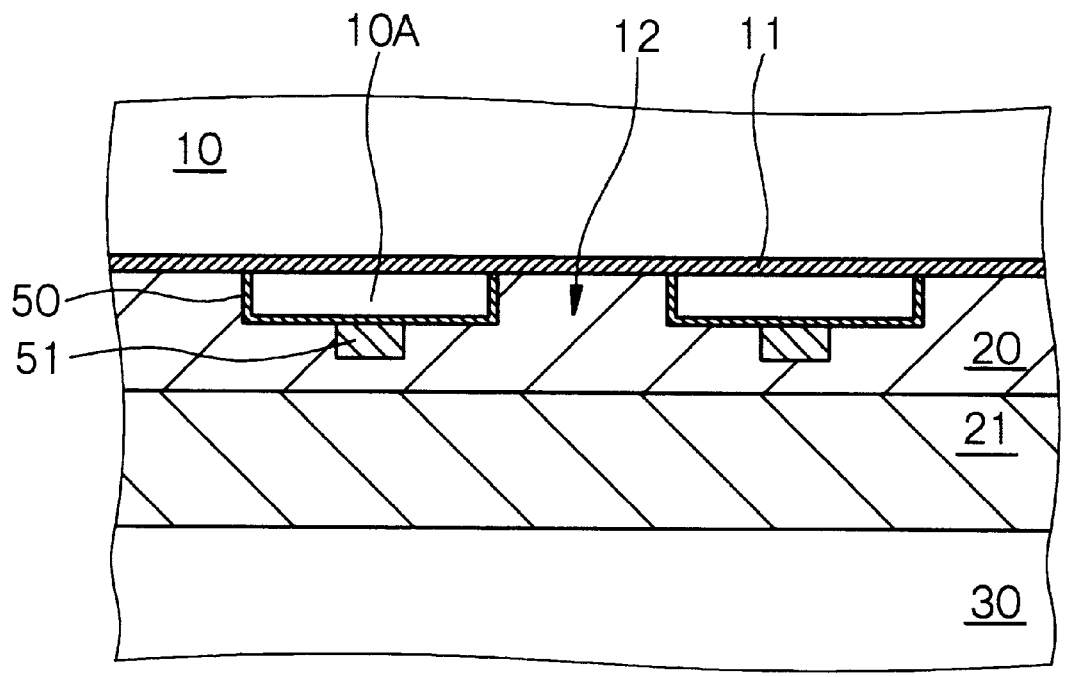
FIGS. 6A and 6B, following
Figure 6B:
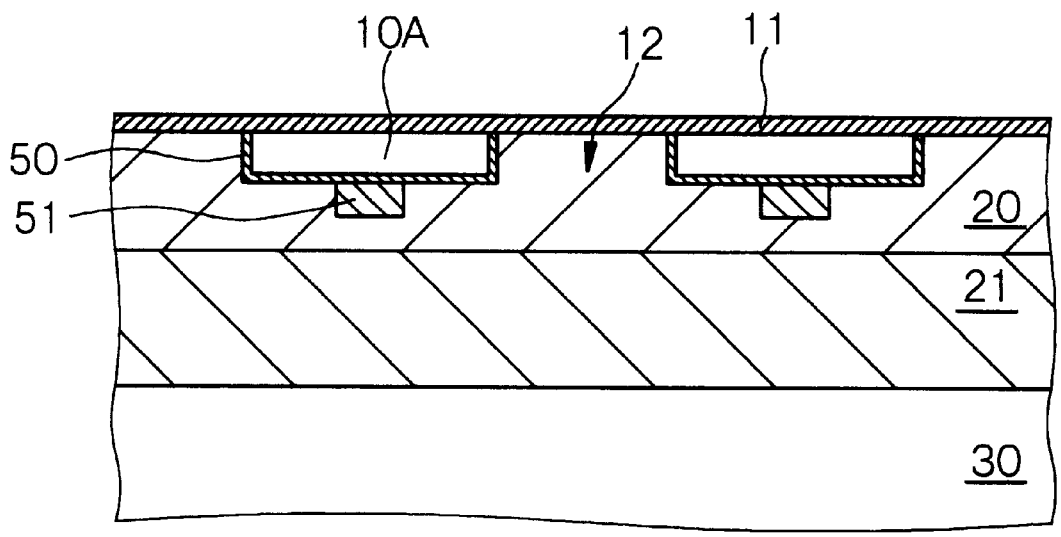
Figure 7A:
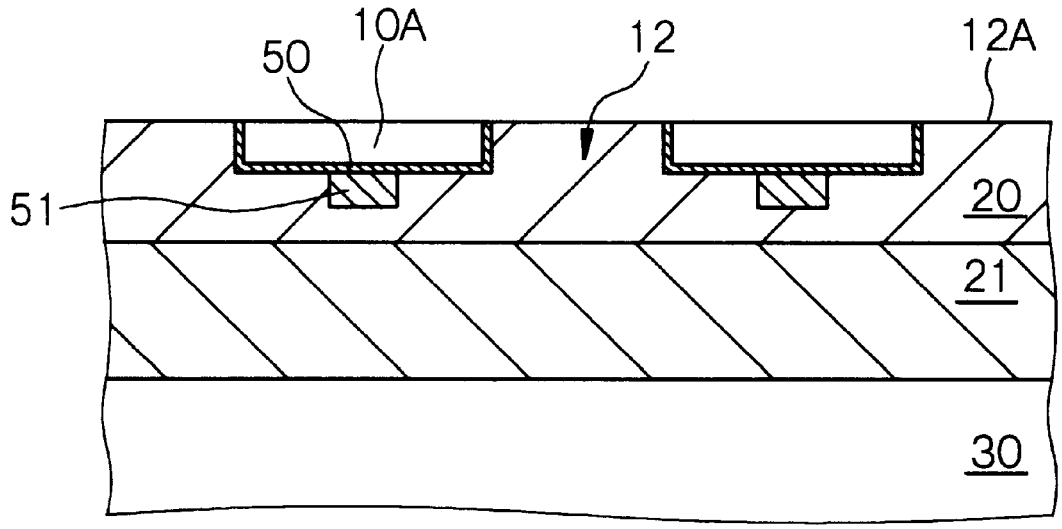
FIGS. 7A and 7B, following
Figure 7B:
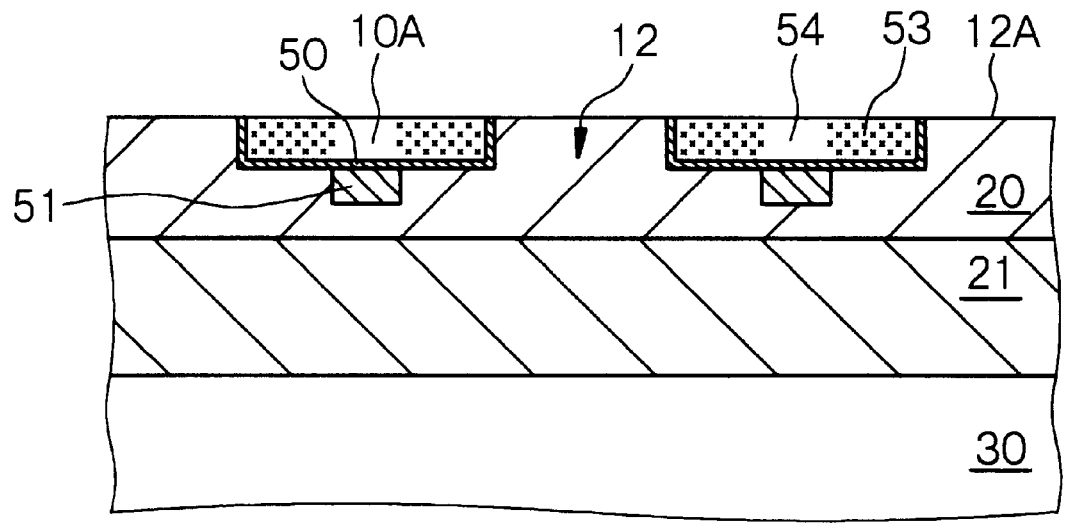

Then, the silicon semiconductor substrate 10 is ground and polished from its rear surface in the same manner as in Step-140 in Example 1, to expose the buried polishing-stop layer 11 (see FIG. 6B).

Then, the buried polishing-stop layer 11 composed of $SiO_2$ is removed by a wet etching method using a hydrofluoric acid aqueous solution to expose the semiconductor layer 10A (see FIG. 7A), whereby the semiconductor layer 10A (thickness 43 nm) surrounded by the insulating layer 20 is left as an SOI layer.

Then, for forming a semiconductor device constituted of a MOS type transistor having a bottom gate structure in the semiconductor layer 10A, the semiconductor layer 10A is ion-implanted by a known method, to form a high-concentration impurity region entirely along the thickness direction of the semiconductor layer 10A, and the impurity provided by the ion-implantation is annealed for its activation. In this manner, source/drain regions 53 and a channel forming region 54 (which correspond to the rest of constituents of the semiconductor device) are formed in the semiconductor layer 10A (see FIG. 7B). Then, an insulating interlayer is formed on the entire surface, opening portions are formed in the insulating interlayer above the source/drain regions 53 as required, a wiring material layer is formed on the insulating interlayer including the insides of the opening portions, and the wiring material layer is patterned, to form a wiring, whereby the semiconductor device in Example 2 can be formed.

EXAMPLE 3

Example 3 is concerned with a process for the production of a semiconductor substrate having a silicon-on-insulator structure according to the second aspect of the present invention and a process for the production of a semiconductor device according to the second aspect of the present invention. In Example 3, a buried polishing-stop layer of $SiO_2$ is formed by ion-implanting a silicon semiconductor substrate with an oxygen ion as well. A semiconductor device constituted of a MOS type transistor is formed in a remaining portion of a semiconductor substrate on an insulating layer. Example 3 will be explained with reference to FIGS. 8A, 8B, 9A, 9B, 10A, 10B and 11 which are schematic partial cross-sectional views of the silicon semiconductor substrate and the like.

Figure 8A:
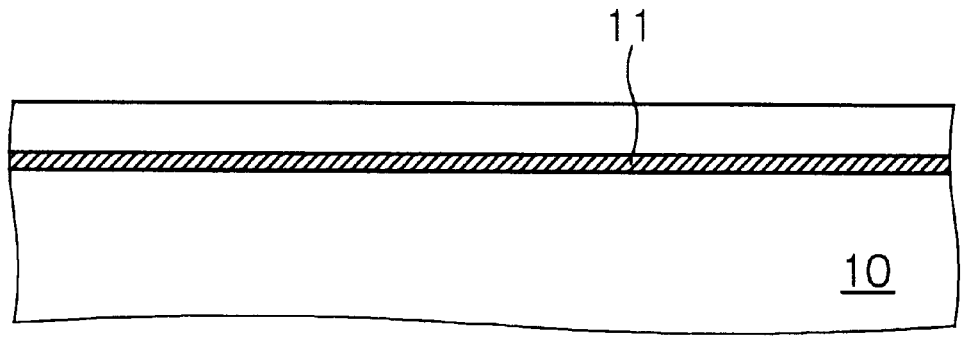
FIGS. 8A and 8B are schematic partial cross-sectional views of a silicon semiconductor substrate, etc., for explaining the steps in Example 3.
Figure 8B:
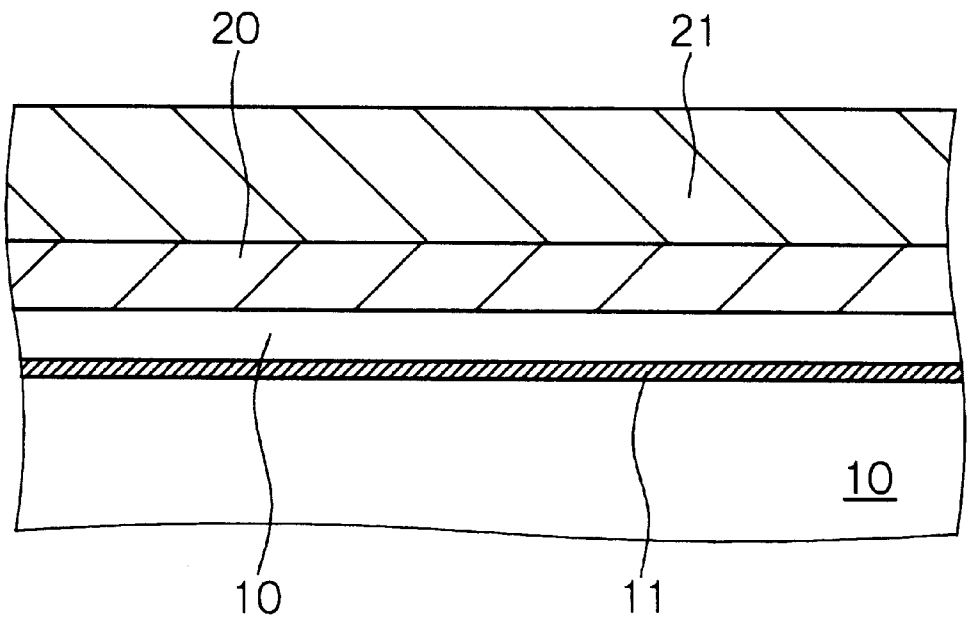

First, a silicon semiconductor substrate 10 is ion-implanted with an oxygen ion and heat-treated in the same manner as in Step-100 in Example 1, whereby a buried polishing-stop layer 11 of $SiO_2$ can be formed inside the silicon semiconductor substrate 10 such that the buried polishing-stop layer 11 has its upper surface positioned 43 nm deep on average from the surface of the silicon semiconductor substrate 10 and has a thickness of approximately 100 nm downwardly (see FIG. 8A).

Then, an approximately 0.6 $\mu m$ thick insulating layer 20 of $SiO_2$ is formed on the silicon semiconductor substrate 10 by a CVD method. Then, a polycrystalline silicon layer 21 which is not an essential requirement is formed on the insulating layer 20, and then, the surface of the polycrystalline silicon layer 21 is planarized (see FIG. 8B).

Figure 9A:
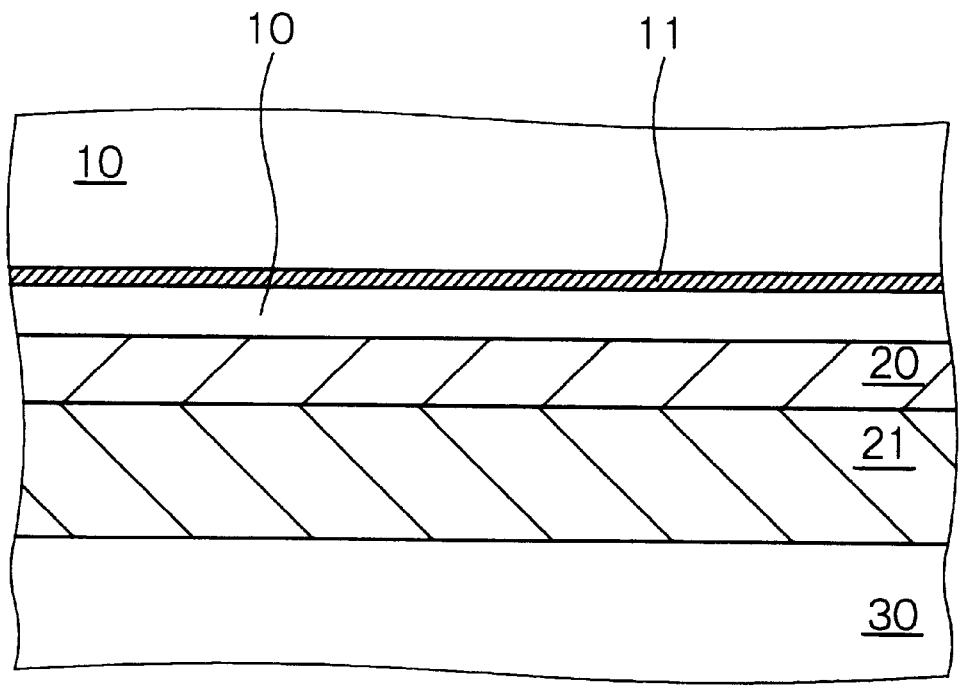
FIGS. 9A and 9B, following
Figure 9B:
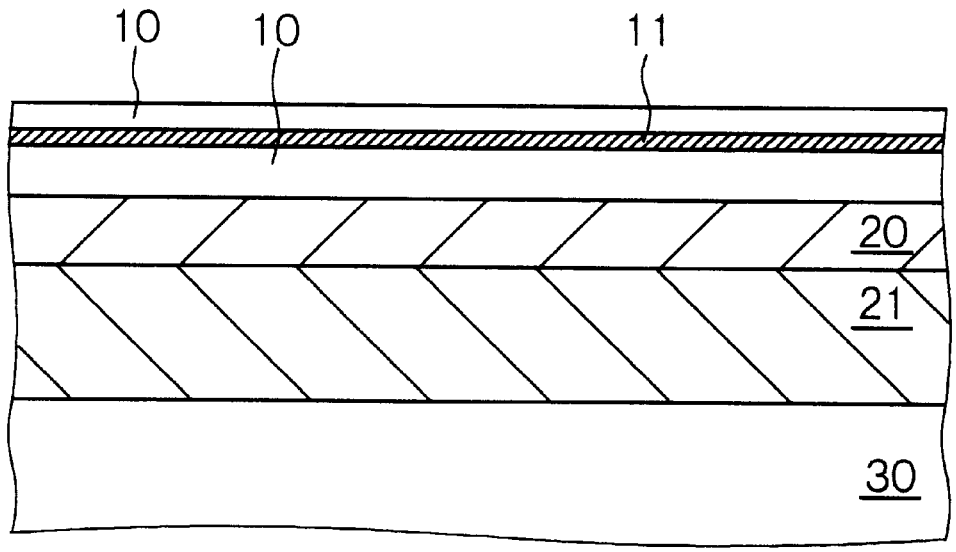

Then, a supporting substrate 30 composed of a silicon semiconductor substrate and the silicon semiconductor substrate 10 are bonded to each other through the insulating layer 20 and the polycrystalline silicon layer 21 in the same manner as in Step-130 in Example 1 (see FIG. 9A).

Then, the silicon semiconductor substrate 10 is ground and polished from its rear surface to expose the buried polishing-stop layer 11. Specifically, the silicon semiconductor substrate 10 is mechanically ground first with diamond grinding grains from its rear surface until the silicon semiconductor substrate 10 is left as one having a thickness of several $\mu m$ above the buried polishing-stop layer 11 so that no grinding damage is caused to remain in the silicon semiconductor substrate 10 (see FIG. 9B). Then, the silicon semiconductor substrate 10 is selectively polished by a chemical/mechanical polishing method (CMP method) using an ethylenediamine hydrate until the buried polishing-stop layer 11 is exposed (see FIG. 10A). The buried polishing-stop layer 11 works as a polishing-stop layer, and the polishing does not proceed any further. Even when the buried polishing-stop layer 11 is formed in the form of islands, the buried polishing-stop layer 11 similarly works as a polishing-stop layer when it is exposed, and the polishing does not proceed any further.

Figure 10A:
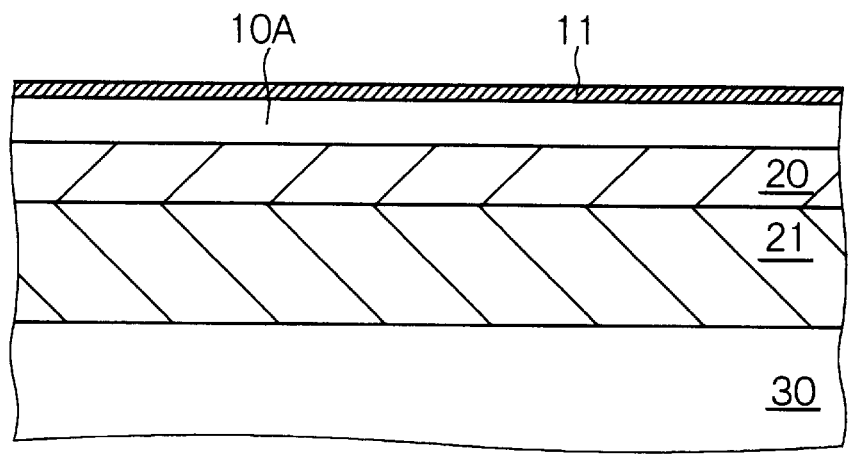
FIGS. 10A and 10B, following
Figure 10B:
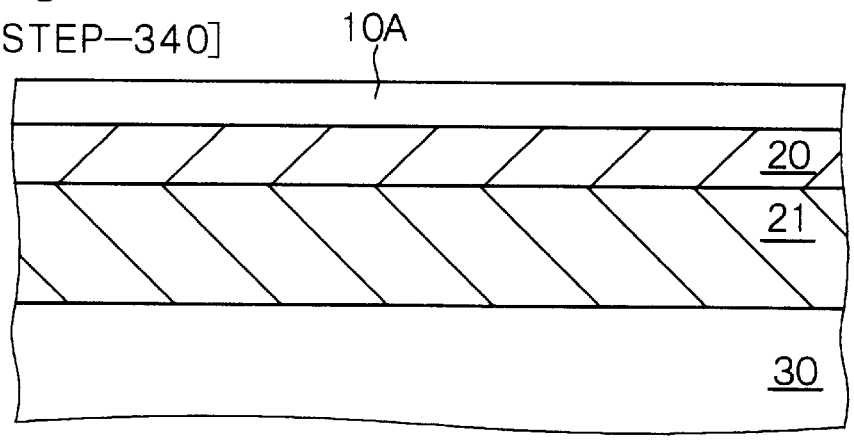
Figure 11:
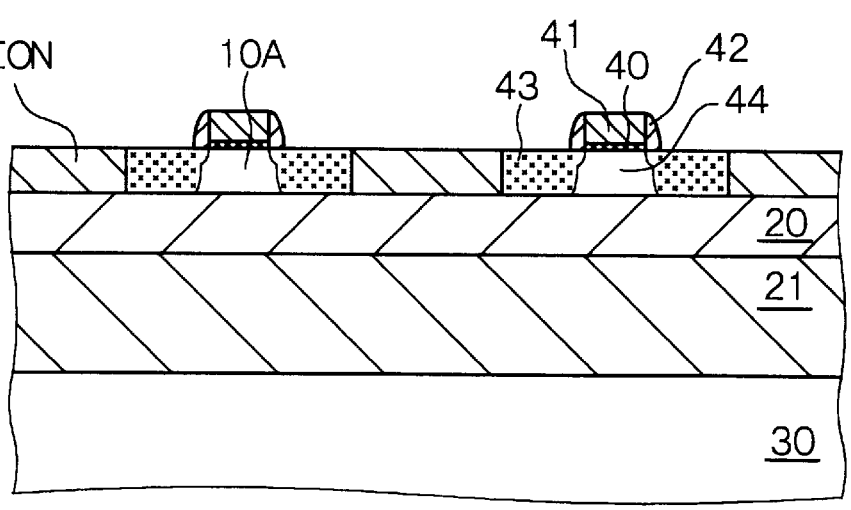
FIG. 11, following

The buried polishing-stop layer 11 composed of $SiO_2$ is removed by a wet etching method using a hydrofluoric acid aqueous solution, to expose a semiconductor layer 10A which is a remaining portion of the silicon semiconductor substrate 10 (see FIG. 10B). In this manner, the remaining portion (semiconductor layer 10A having a thickness of 43 nm) of the semiconductor substrate formed on the insulating layer 20 is left as an SOI layer on the insulating layer 20. According to the above steps, a semiconductor substrate having a silicon-on-insulator structure can be produced.

Then, a semiconductor device constituted of a MOS type transistor is formed in the semiconductor layer 10A which is the remaining portion of the semiconductor substrate in the same manner as in Step-160 in Example 1. That is, a device isolation region is formed in the semiconductor layer 10A, and the surface of the semiconductor layer 10A is thermally oxidized to form a gate insulating film 40. Then, a gate electrode 41 having, for example, a polyside structure is formed. And, for forming an LDD structure, the semiconductor layer 10A is ion-implanted for forming a low-concentration impurity region, and then, a gate side-wall 42 is formed on the side wall of the gate electrode 41. Then, the semiconductor layer 10A is ion-implanted to form a high-concentration impurity region entirely along the thickness direction of the semiconductor layer 10A, and the impurity provided by the ion-implantation is annealed for its activation, to form source/drain regions 43 and a channel forming region 44 in the semiconductor layer 10A (see FIG. 11). Then, an insulating interlayer is formed on the entire surface, opening portions are formed in the insulating interlayer above the source/drain regions 43 as required, a wiring material layer is formed on the insulating interlayer including the insides of the opening portions, and the wiring material layer is patterned to form a wiring, whereby the semiconductor device is formed.

EXAMPLE 4

Example 4 is concerned with a process for the production of a semiconductor device according to the fourth aspect of the present invention. In Example 4, a buried polishing-stop layer of $SiO_2$ is formed by ion-implanting a silicon semiconductor substrate with an oxygen ion as well. In Example 4, like Example 2, part of constituents of a semiconductor device is a gate electrode for forming a bottom gate structure, and the rest of the constituents of the semiconductor device is source/drain regions for a MOS type transistor having a bottom gate structure. Example 4 will be explained with reference to FIGS. 12A, 12B, 12C, 13A, 13B, 14A and 14B which are schematic partial cross-sectional views of the silicon semiconductor substrate and the like.

First, a silicon semiconductor substrate 10 is ion-implanted with an oxygen ion and heat-treated in the same manner as in Step-100 in Example 1, whereby a buried polishing-stop layer 11 of $SiO_2$ can be formed inside the silicon semiconductor substrate 10 such that the buried polishing-stop layer 11 has its upper surface positioned 43 nm deep on average from the surface of the silicon semiconductor substrate 10 and has a thickness of approximately 100 nm downwardly.

Figure 12A:
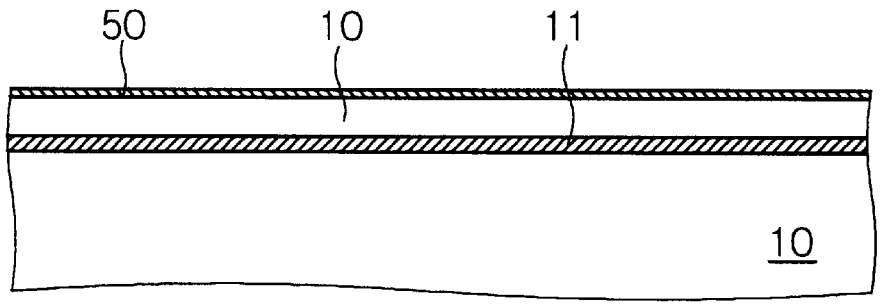
FIGS. 12A, 12B and 12C are schematic partial cross-sectional views of a silicon semiconductor substrate, etc., for explaining the steps in Example 4.
Figure 12B:
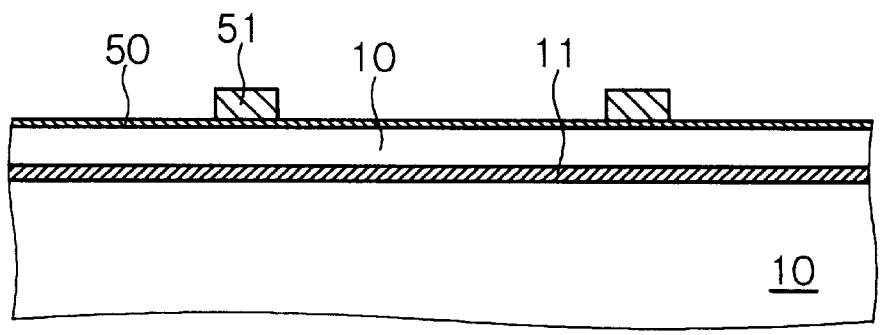
Figure 12C:
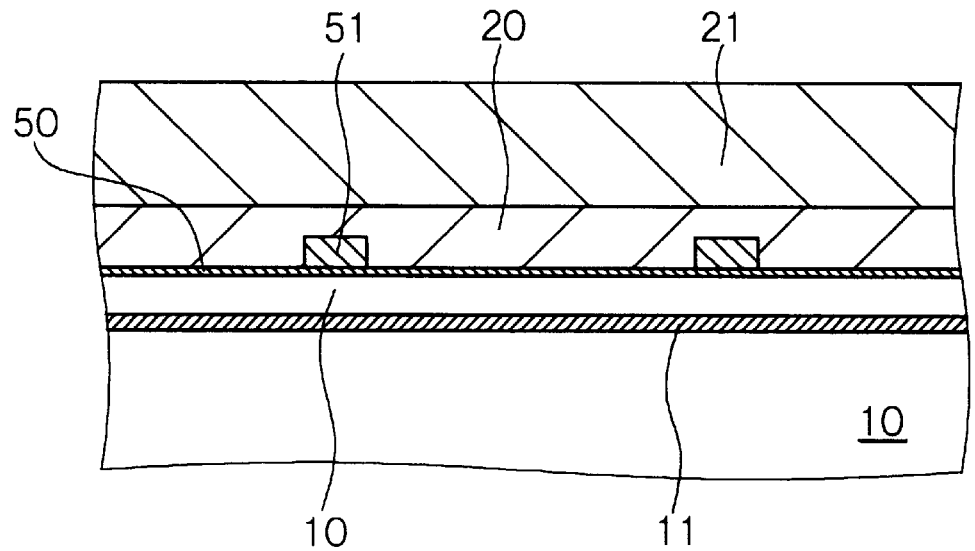

Then, an insulating film 50 is formed on the surface of the silicon semiconductor substrate 10 by a thermal oxidation method (see FIG. 12A). Then, a gate electrode 51 which is part of constituents of a semiconductor device is formed on the insulating film 50 (see FIG. 12B). Specifically, for example, a polycrystalline silicon layer containing an impurity is deposited on the entire surface, and then, the polycrystalline silicon layer is patterned, whereby the gate electrode 51 can be formed.

Then, an interlayer is formed on the entire surface, and then, the semiconductor substrate and a supporting substrate are bonded to each other through the interlayer. Specifically, an insulating layer 20 of $SiO_2$ and a polycrystalline silicon layer 21 are consecutively deposited on the entire surface by known CVD methods, and then, the polycrystalline silicon layer 21 is planarized (see FIG. 12C). Then, a supporting substrate 30 composed of a silicon semiconductor substrate and the silicon semiconductor substrate 10 are bonded to each other through the insulating layer 20 and the polycrystalline silicon layer 21 in the same manner as in Step-130 in Example 1 (see FIG. 13A).

Figure 13A:
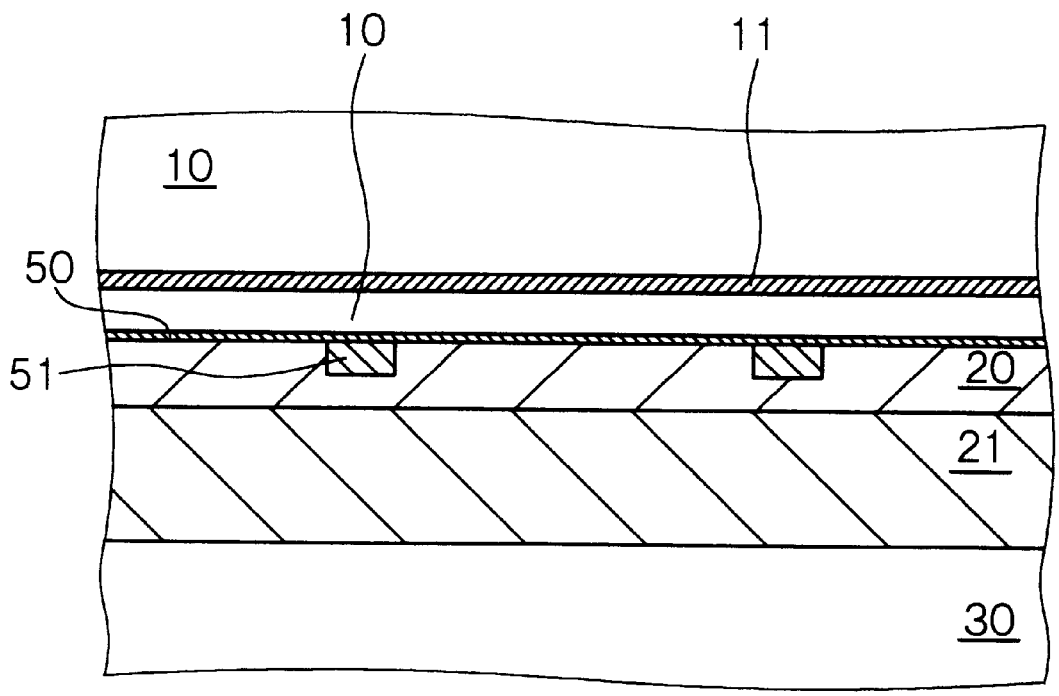
FIGS. 13A and 13B, following
Figure 13B:
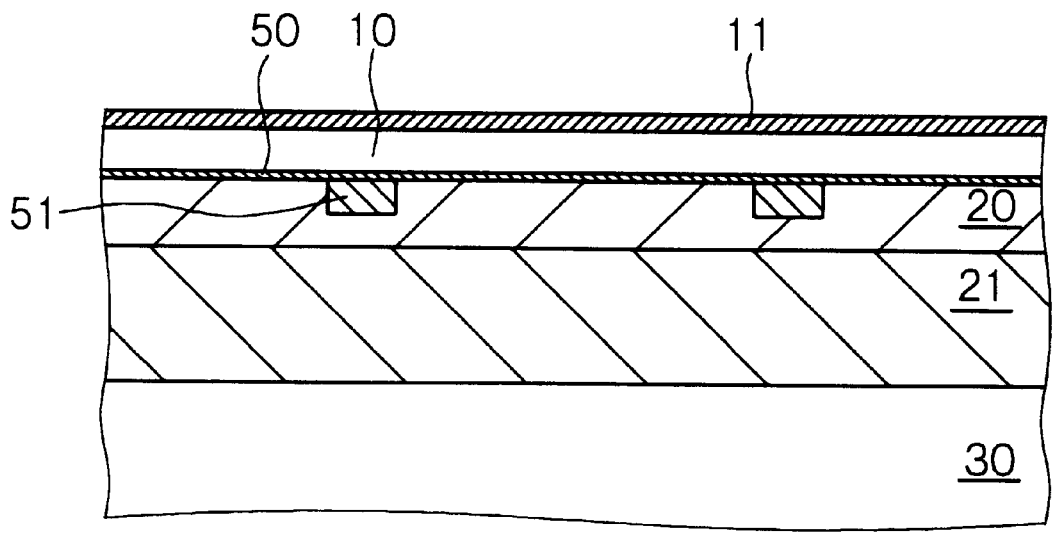

Then, the silicon semiconductor substrate 10 is ground and polished from its rear surface in the same manner as in Step-140 in Example 1, to expose the buried polishing-stop layer 11 (see FIG. 13B).

Figure 14A:
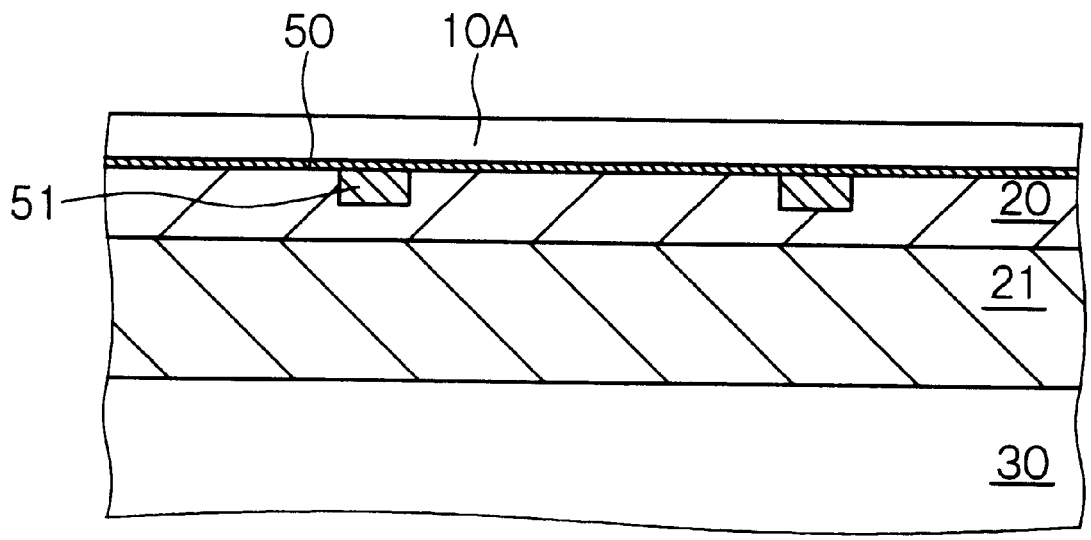
FIGS. 14A and 14B, following

Then, the buried polishing-stop layer 11 composed of $SiO_2$ is removed by a wet etching method using a hydrofluoric acid aqueous solution, to expose a semiconductor layer 10A which is a remaining portion of the semiconductor substrate (see FIG. 14A). In this manner, the remaining portion (semiconductor layer 10A having a thickness of 43 nm) of the semiconductor substrate formed on the insulating layer 20 is left as an SOI layer on the insulating layer 20.

Figure 14B:
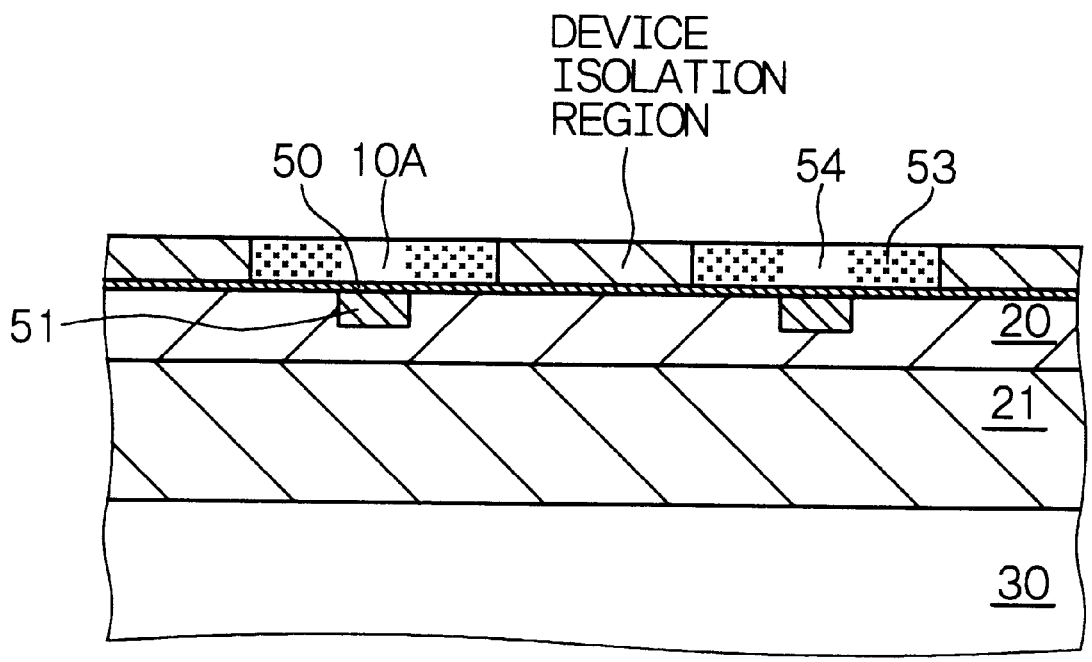
Figure 15A:
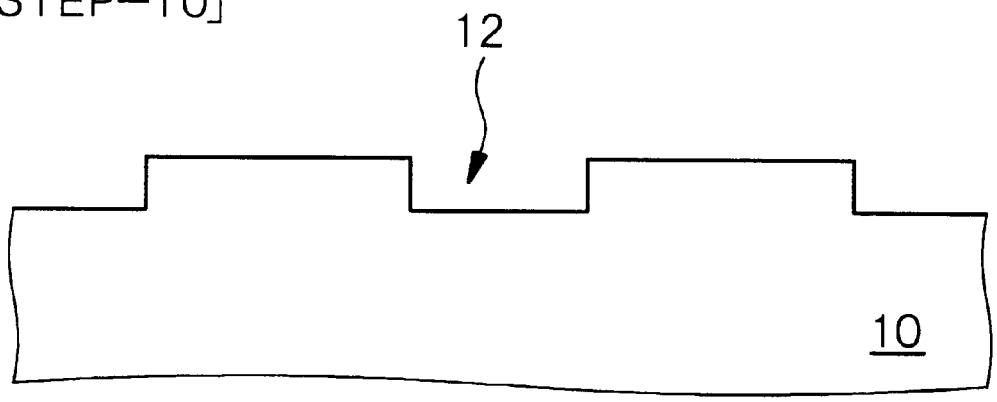
FIGS. 15A and 15B are schematic partial cross-sectional views of a semiconductor substrate, etc., for explaining the steps of a conventional substrate-bonding method.
Figure 15B:
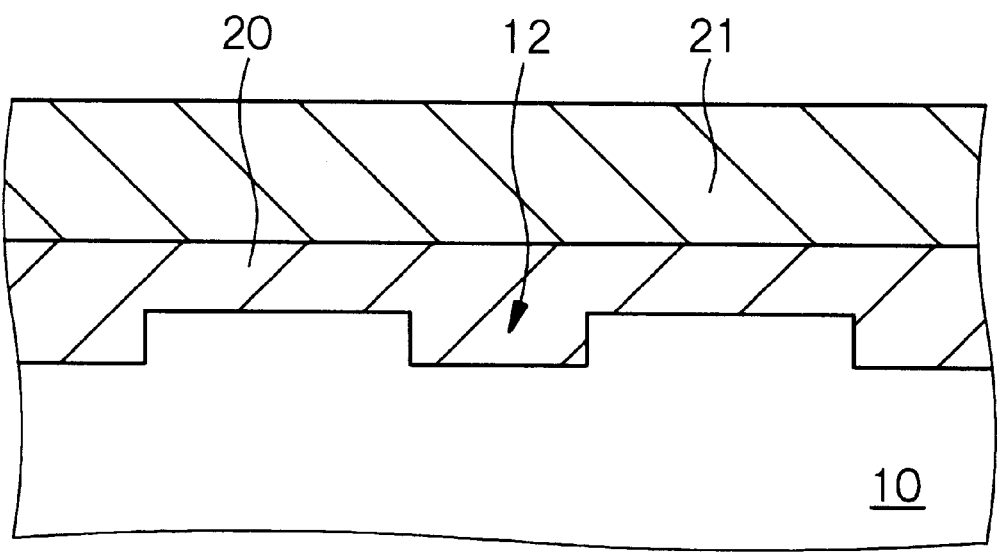
Figure 16A:
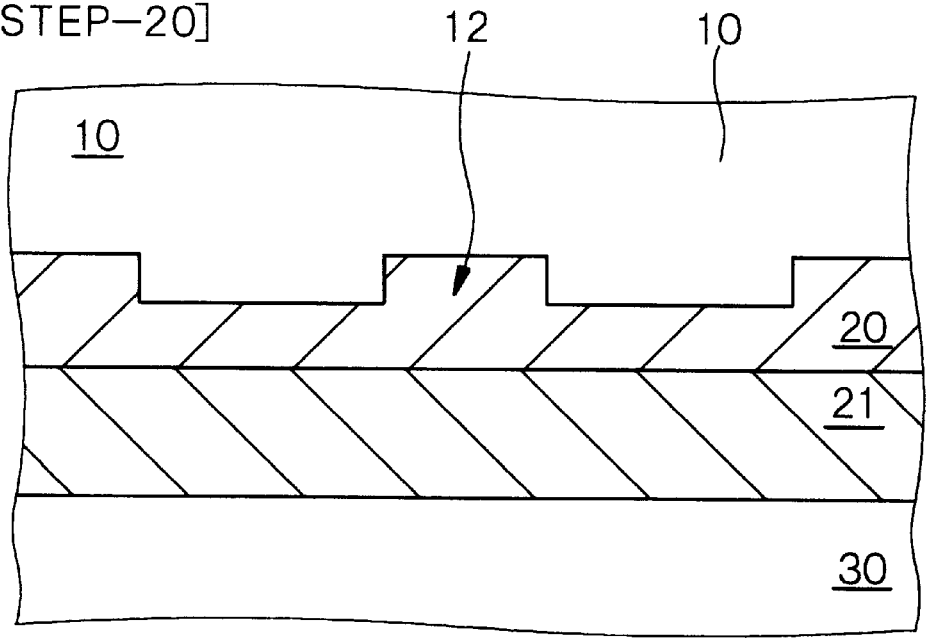
FIGS. 16A and 16B, following
Figure 16B:
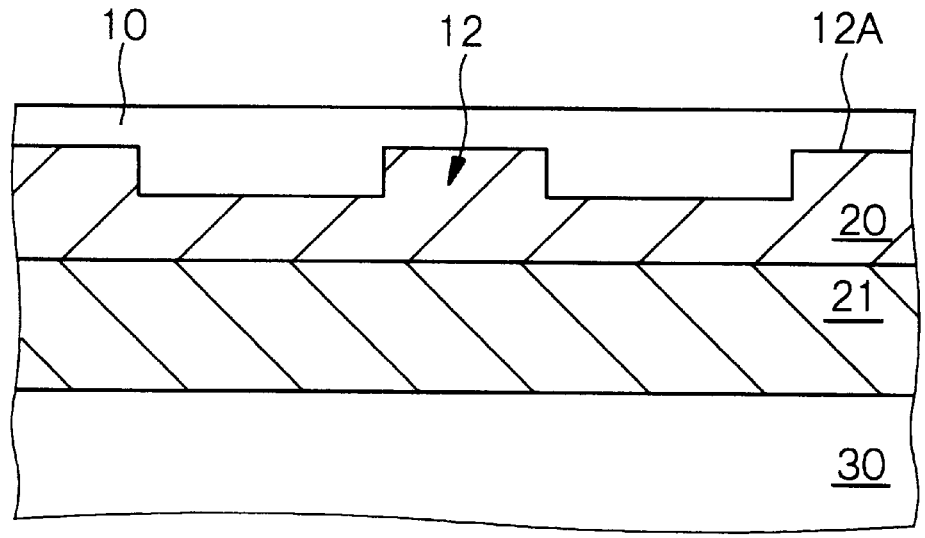
Figure 17:
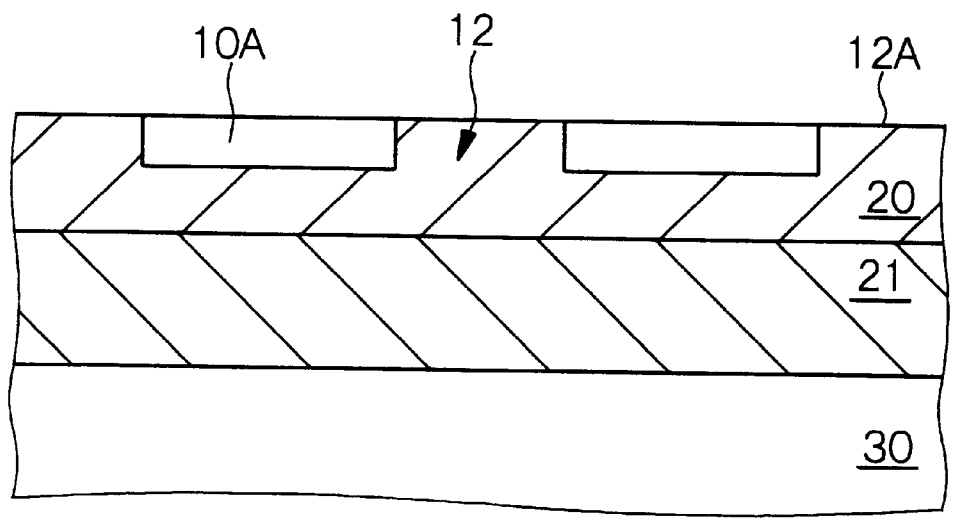
FIG. 17 following
Figure 18:
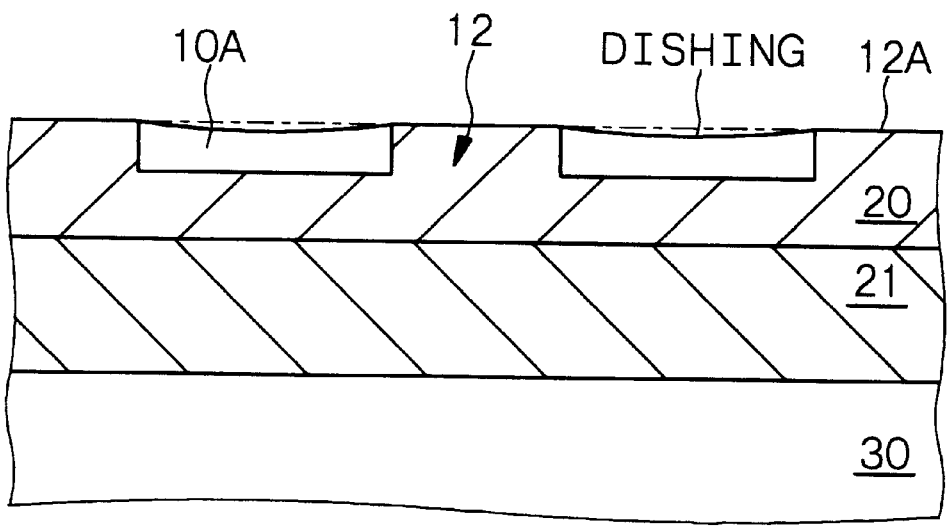
FIG. 18 is a schematic partial cross-sectional view of a silicon semiconductor substrate, etc., for explaining problems in the conventional substrate-bonding method.

Then, a device isolation region is formed, and for forming a semiconductor device constituted of a MOS type transistor having a bottom gate structure in the semiconductor layer 10A, the semiconductor layer 10A is ion-implanted by a conventional method, to form a high-concentration impurity region entirely along the thickness direction of the semiconductor layer 10A, and the impurity provided by the ion-implantation is annealed for its activation, whereby source/drain regions 53 and a channel forming region 54 (which correspond to the rest of constituents of the semiconductor device) are formed in the semiconductor layer 10A (see FIG. 14B). Then, an insulating interlayer is formed on the entire surface, opening portions are formed in the insulating interlayer above the source/drain regions 53 as required, a wiring material layer is formed on the insulating interlayer including the insides of the opening portions, and the wiring material layer is patterned to form a wiring, whereby the semiconductor device can be formed.

The present invention has been explained with reference to Examples hereinabove, while the present invention shall not be limited thereto. In any of Examples 2 to 4, an ozone ion, a nitrogen ion or a germanium ion may be ion-implanted in place of an oxygen ion, to form the buried polishing-stop layer. The various conditions, the thickness data and the semiconductor device structures explained in Examples are give for illustrative purposes, and they may be altered as required.

In the present invention, the depth of the buried polishing-stop layer from the surface of the semiconductor substrate can be controlled with a high accuracy, and the semiconductor layer or the remaining portion of the semiconductor substrate having a high thickness accuracy can be easily formed, so that the micro-processing for the semiconductor device can be easily carried out. Further, the buried polishing-stop layer having a very small thickness is formed, so that the occurrence of a high density of crystal defects can be prevented when the buried polishing-stop layer is formed by ion-implantation. As a result, the occurrence of malfunction of a semiconductor device can be prevented, and a highly reliable semiconductor device can be produced. Further, by defining the thickness of a semiconductor layer, for example, the source/drain regions of a MOS type transistor can be formed entirely along the thickness direction of the SOI layer. As a result, the high-speed performance at a low voltage from a power source can be accomplished, and highly reliable semiconductor devices can be produced at high yields.

What is claimed is:
1. A process for the production of a semiconductor substrate having a silicon-on-insulator structure comprising the steps of;
   (A) ion-implanting a semiconductor substrate to form a buried polishing-stop layer inside the semiconductor substrate,

(B) patterning a portion of the semiconductor substrate above the buried polishing-stop layer to form a trench portion which reaches the buried polishing-stop layer, thereby forming a semiconductor layer on the buried polishing-stop layer, (C) forming an insulating layer on the semiconductor layer and the buried polishing-stop layer, (D) bonding the semiconductor substrate and a supporting substrate to each other through the insulating layer, (E) grinding and polishing the semiconductor substrate from a rear surface to expose the buried polishing-stop layer, and (F) removing the buried polishing-stop layer to expose the semiconductor layer, wherein the semiconductor layer has a thickness of $2 \times 10^{-8}$ m to $1 \times 10^{-7}$ m and the buried polishing-stop layer has a thickness of $2 \times 10^{-9}$ m to $1 \times 10^{-8}$ m.

2. The process for the production of a semiconductor substrate having a silicon-on-insulator structure according to claim 1, wherein, when forming the buried polishing-stop layer inside the semiconductor substrate, the semiconductor substrate is ion-implanted under a condition where the acceleration energy of an ion is set at 10 keV to 100 keV and the dosage of the ion is set at $1 \times 10^{16}$ cm$^{-2}$ to $1 \times 10^{17}$ cm$^2$.

3. The process for the production of a semiconductor substrate having a silicon-on-insulator structure according to claim 1, wherein an ion used for the ion-implantation is selected from a group consisting of an oxygen ion, an ozone ion, a nitrogen ion and a germanium ion.

4. The process for the production of a semiconductor substrate having a silicon-on-insulator structure according to claim 1, wherein in the step (C) said insulating layer is an SiO$_2$ layer and is formed on an entirety of a surface that includes said semi-conductor layer and said buried polishing-stop layer by a chemical vapor deposition method.

5. A process for the production of a semiconductor device comprising the steps of;

(A) ion-implanting a semiconductor substrate to form a buried polishing-stop layer inside the semiconductor substrate, (B) patterning a portion of the semiconductor substrate above the buried polishing-stop layer to form a trench portion which reaches the buried polishing-stop layer, thereby forming a semiconductor layer on the buried polishing-stop layer, (C) forming an insulating layer on the semiconductor layer and the buried polishing-stop layer, (D) bonding the semiconductor substrate and a supporting substrate to each other through the insulating layer, (E) grinding and polishing the semiconductor substrate from a rear surface to expose the buried polishing-stop layer, (F) removing the buried polishing-stop layer to expose the semiconductor layer, and (G) forming a semiconductor device in the semiconductor layer, wherein the semiconductor layer has a thickness of $2 \times 10^{-8}$ m to $1 \times 10^{-7}$ m and the buried polishing-stop layer has a thickness of $2 \times 10^{-9}$ m to $1 \times 10^{-8}$ m.

6. The process for the production of a semiconductor device according to claim 5, wherein, when forming the buried polishing-stop layer inside the semiconductor substrate, the semiconductor substrate is ion-implanted under a condition where the acceleration energy of an ion is set at 10 keV to 100 keV and the dosage of the ion is set at $1 \times 10^{16}$ cm–2 to $1 \times 10^{17}$ cm–2.

7. The process for the production of a semiconductor device according to claim 5, wherein an ion used for the ion-implantation is selected from a group consisting of an oxygen ion, an ozone ion, a nitrogen ion and a germanium ion.

8. A process for the production of a semiconductor device comprising the steps of;

(A) ion-implanting a semiconductor substrate to form a buried polishing-stop layer inside the semiconductor substrate, (B) patterning a portion of the semiconductor substrate above the buried polishing-stop layer to form a trench portion which reaches the buried polishing-stop layer, thereby forming a semiconductor layer on the buried polishing-stop layer, (C) forming an insulating film on a surface of the semiconductor layer, (D) forming part of constituents of a semiconductor device on the insulating film, (E) forming an interlayer on an entire surface of said insulating film and then bonding the semiconductor substrate and a supporting substrate through the interlayer, (F) grinding and polishing the semiconductor substrate from a rear surface to expose the buried polishing-stop layer, (G) removing the buried polishing-stop layer to expose the semiconductor layer, and (H) forming constituents of the semiconductor device in the semiconductor layer that were not formed in step (D), wherein the semiconductor layer has a thickness of $2 \times 10^{-8}$ m to $1 \times 10^{-7}$ m and the buried polishing-stop layer has a thickness of $2 \times 10^{-9}$ m to $1 \times 10^{-8}$ m.

9. The process for the production of a semiconductor device according to claim 8, wherein, when forming the buried polishing-stop layer inside the semiconductor substrate, the semiconductor substrate is ion-implanted under a condition where the acceleration energy of an ion is set at 10 keV to 100 keV and the dosage of the ion is set at $1 \times 10^{16}$ cm$^{-2}$ to $1 \times 10^{17}$ cm$^{-2}$.

10. The process for the production of a semiconductor device according to claim 8, wherein an ion used for the ion-implantation is selected from a group consisting of an oxygen ion, an ozone ion, a nitrogen ion and a germanium ion.

11. A process for the production of a semiconductor substrate having a silicon-on-insulator structure comprising the steps of;

(A) ion-implanting a semiconductor substrate to form a buried polishing-stop layer inside the semiconductor substrate, (B) forming an insulating layer on the semiconductor substrate, (C) bonding the semiconductor substrate and a supporting substrate to each other through the insulating layer, (D) grinding and polishing the semiconductor substrate from a rear surface to expose the buried polishing-stop layer, and (E) removing the buried polishing-stop layer to expose a remaining portion of the semiconductor substrate, wherein the remaining portion of the semiconductor substrate has a thickness of $2 \times 10^{-8}$ m to $1 \times 10^{-7}$ m and the buried polishing-stop layer has a thickness of $2 \times 10^{-9}$ m to $1 \times 10^{-8}$ m.

12. The process for the production of a semiconductor substrate having a silicon-on-insulator structure according to claim 11, wherein, when forming the buried polishing-stop layer inside the semiconductor substrate, the semiconductor substrate is ion-implanted under a condition where the acceleration energy of an ion is set at 10 keV to 100 keV and the dosage of the ion is set at $1\times10^{16}$ cm$^2$ to $1\times10_{17}$ cm$^2$.

13. The process for the production of a semiconductor substrate having a silicon-on-insulator structure according to claim 11, wherein an ion used for the ion-implantation is selected from a group consisting of an oxygen ion, an ozone ion, a nitrogen ion and a germanium ion.

14. The process for the production of a semiconductor substrate having a silicon-on-insulator structure according to claim 11, in which the step (B) is a step of forming an SiO$_2$ layer on an entire surface of said semiconductor substrate by a chemical vapor deposition method.

15. A process for the production of a semiconductor device comprising the steps of;
- (A) ion-implanting a semiconductor substrate to form a buried polishing-stop layer inside the semiconductor substrate,
- (B) forming an insulating layer on the semiconductor substrate,
- (C) bonding the semiconductor substrate and a supporting substrate to each other through the insulating layer,
- (D) grinding and polishing the semiconductor substrate from a rear surface to expose the buried polishing-stop layer,
- (E) removing the buried polishing-stop layer to expose a remaining portion of the semiconductor substrate, and
- (F) forming a semiconductor device in the remaining portion of the semiconductor substrate,
- wherein the remaining portion of the semiconductor substrate has a thickness of $2\times10^{-8}$ m to $1\times10^{-7}$ m and the buried polishing-stop layer has a thickness of $2\times10^{-9}$ m to $1\times10^{-8}$ m.

16. The process for the production of a semiconductor device according to claim 15, wherein, when forming the buried polishing-stop layer inside the semiconductor substrate, the semiconductor substrate is ion-implanted under a condition where the acceleration energy of an ion is set at 10 keV to 100 keV and the dosage of the ion is set at $1\times10^{16}$ cm$^{-2}$ to $1\times10^{17}$ cm$^{-2}$.

17. The process for the production of a semiconductor device according to claim 15, wherein an ion used for the ion-implantation is selected from a group consisting of an oxygen ion, an ozone ion, a nitrogen ion and a germanium ion.

18. A process for the production of a semiconductor device comprising the steps of;
- (A) ion-implanting a semiconductor substrate to form a buried polishing-stop layer inside the semiconductor substrate,
- (B) forming an insulating film on a surface of the semiconductor substrate,
- (C) forming part of constituents of a semiconductor device on the insulating film,
- (D) forming an interlayer on an entire surface of said insulating film and then bonding the semiconductor substrate and a supporting substrate through the interlayer,
- (E) grinding and polishing the semiconductor substrate from a rear surface to expose the buried polishing-stop layer,
- (F) removing the buried polishing-stop layer to expose a remaining portion of the semiconductor substrate, and
- (G) forming constituents of the semiconductor device that were not formed in step (D) in the remaining portion of the semiconductor substrate,
- wherein the remaining portion of the semiconductor substrate has a thickness of $2\times10^{-8}$ m to $1\times10^{-7}$ m and the buried polishing-stop layer has a thickness of $2\times10^{-9}$ m to $1\times10^{-8}$ m.

19. The process for the production of a semiconductor device according to claim 18, wherein, when forming the buried polishing-stop layer inside the semiconductor substrate, the semiconductor substrate is ion-implanted under a condition where the acceleration energy of an ion is set at 10 keV to 100 keV and the dosage of the ion is set at $1\times10^{16}$ cm$^{-2}$ to $1\times10^{17}$ cm$^2$.

20. The process for the production of a semiconductor device according to claim 18, wherein an ion used for the ion-implantation is selected from a group consisting of an oxygen ion, an ozone ion, a nitrogen ion and a germanium ion.

* * * * *

UNITED STATES PATENT AND TRADEMARK OFFICE
CERTIFICATE OF CORRECTION

PATENT NO. : 6,169,000 B1
DATED : January 2, 2001
INVENTOR(S) : Yasunori Ohkubo

It is certified that error appears in the above-identified patent and that said Letters Patent is hereby corrected as shown below:

<u>Column 15,</u>
Line 67, change "cm-2 to 1x10$^{17}$ cm-2" to -- cm$^{-2}$ to 1 x 10$^{17}$ cm$^{-2}$ --.

<u>Column 17,</u>
Line 7, change "cm$^2$ to 1x10$_{17}$ cm$^2$" to -- cm$^{-2}$ to 1 x 10$_{17}$ cm$^{-2}$ --.

Signed and Sealed this

Ninth Day of December, 2003

JAMES E. ROGAN
*Director of the United States Patent and Trademark Office*